US008191791B2

(12) United States Patent
Ikemoto et al.

(10) Patent No.: US 8,191,791 B2
(45) Date of Patent: Jun. 5, 2012

(54) WIRELESS IC DEVICE AND ELECTRONIC APPARATUS

(75) Inventors: Nobuo Ikemoto, Moriyama (JP); Satoshi Ishino, Kusatsu (JP); Yuya Dokai, Nagaokakyo (JP); Noboru Kato, Moriyama (JP); Takeshi Kataya, Ritto (JP); Ikuhei Kimura, Nara (JP); Mikiko Tanaka, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/022,695

(22) Filed: Feb. 8, 2011

(65) Prior Publication Data

US 2011/0127337 A1    Jun. 2, 2011

Related U.S. Application Data

(63) Continuation of application No. 12/503,188, filed on Jul. 15, 2009, now Pat. No. 7,997,501, which is a continuation of application No. PCT/JP2008/062947, filed on Jul. 17, 2008.

(30) Foreign Application Priority Data

Jul. 17, 2007  (JP) ................................. 2007-185439
Oct. 18, 2007  (JP) ................................. 2007-271861
Mar. 31, 2008  (JP) ................................. 2008-092848

(51) Int. Cl.
*G06K 19/06* (2006.01)
(52) U.S. Cl. ....................................................... 235/492
(58) Field of Classification Search .................. 235/492, 235/493
See application file for complete search history.

(56) References Cited

U.S. PATENT DOCUMENTS

| 3,364,564 A | 1/1968 | Kurtz et al. |
| 4,794,397 A | 12/1988 | Ohe et al. |
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |

(Continued)

FOREIGN PATENT DOCUMENTS

DE    10 2006 057 369 A1    6/2008

(Continued)

OTHER PUBLICATIONS

English translation of NL9100176, published on Mar. 2, 1992.

(Continued)

*Primary Examiner* — Seung Lee
(74) *Attorney, Agent, or Firm* — Keating & Bennett, LLP

(57) ABSTRACT

A wireless IC device that is miniaturized, allows simple and low-cost mounting of a wireless IC, and eliminates the possibility of damage occurring to the wireless IC due to static electricity, and an electronic apparatus equipped with the wireless IC device, includes a wireless IC chip that processes transmission and reception signals, and a feeder circuit substrate that includes a resonant circuit having an inductance element. Feeder electrodes are provided on a surface of the feeder circuit substrate and are electromagnetically coupled to the resonant circuit. The feeder electrodes and are electromagnetically coupled to radiation plates and provided for a printed wiring board. The wireless IC chip is activated by a signal received by the radiation plates and a response signal from the wireless IC chip is radiated outward from the radiation plates.

28 Claims, 21 Drawing Sheets

U.S. PATENT DOCUMENTS

| | | | |
|---|---|---|---|
| 5,491,483 A | 2/1996 | D'Hont |
| 5,528,222 A | 6/1996 | Moskowitz et al. |
| 5,757,074 A | 5/1998 | Matloubian et al. |
| 5,854,480 A | 12/1998 | Noto |
| 5,903,239 A | 5/1999 | Takahashi et al. |
| 5,936,150 A | 8/1999 | Kobrin et al. |
| 5,955,723 A | 9/1999 | Reiner |
| 5,995,006 A | 11/1999 | Walsh |
| 6,104,611 A | 8/2000 | Glover et al. |
| 6,107,920 A | 8/2000 | Eberhardt et al. |
| 6,172,608 B1 | 1/2001 | Cole |
| 6,181,287 B1 | 1/2001 | Beigel |
| 6,190,942 B1 | 2/2001 | Wilm et al. |
| 6,249,258 B1 | 6/2001 | Bloch et al. |
| 6,259,369 B1 | 7/2001 | Monico |
| 6,271,803 B1 | 8/2001 | Watanabe et al. |
| 6,335,686 B1 | 1/2002 | Goff et al. |
| 6,362,784 B1 | 3/2002 | Kane et al. |
| 6,367,143 B1 | 4/2002 | Sugimura |
| 6,378,774 B1 | 4/2002 | Emori et al. |
| 6,406,990 B1 | 6/2002 | Kawai |
| 6,448,874 B1 | 9/2002 | Shiino et al. |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,812,707 B2 | 11/2004 | Yonezawa et al. |
| 6,828,881 B2 | 12/2004 | Mizutani et al. |
| 6,837,438 B1 | 1/2005 | Takasugi et al. |
| 6,861,731 B2 | 3/2005 | Buijsman et al. |
| 6,927,738 B2 | 8/2005 | Senba et al. |
| 6,963,729 B2 | 11/2005 | Uozumi |
| 7,088,249 B2 | 8/2006 | Senba et al. |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,405,664 B2 | 7/2008 | Sakama et al. |
| 7,988,059 B2 * | 8/2011 | Grasset et al. ............... 235/492 |
| 2002/0011967 A1 | 1/2002 | Goff et al. |
| 2002/0015002 A1 | 2/2002 | Yasukawa et al. |
| 2002/0044092 A1 | 4/2002 | Kushihi |
| 2002/0067316 A1 | 6/2002 | Yokoshima et al. |
| 2002/0093457 A1 | 7/2002 | Hamada et al. |
| 2003/0006901 A1 | 1/2003 | Kim et al. |
| 2003/0020661 A1 | 1/2003 | Sato |
| 2003/0045324 A1 | 3/2003 | Nagumo et al. |
| 2003/0169153 A1 | 9/2003 | Muller |
| 2004/0001027 A1 | 1/2004 | Killen et al. |
| 2004/0026519 A1 | 2/2004 | Usami et al. |
| 2004/0056823 A1 | 3/2004 | Zuk et al. |
| 2004/0066617 A1 | 4/2004 | Hirabayashi et al. |
| 2004/0145529 A1 | 7/2004 | Iguchi et al. |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2004/0252064 A1 | 12/2004 | Yuanzhu |
| 2005/0092836 A1 | 5/2005 | Kudo |
| 2005/0099337 A1 | 5/2005 | Takei et al. |
| 2005/0125093 A1 | 6/2005 | Kikuchi et al. |
| 2005/0134460 A1 | 6/2005 | Usami |
| 2005/0134506 A1 | 6/2005 | Egbert |
| 2005/0138798 A1 | 6/2005 | Sakama et al. |
| 2005/0140512 A1 | 6/2005 | Sakama et al. |
| 2005/0232412 A1 | 10/2005 | Ichihara et al. |
| 2005/0236623 A1 | 10/2005 | Takechi et al. |
| 2005/0275539 A1 | 12/2005 | Sakama et al. |
| 2006/0000915 A1 | 1/2006 | Kodukula et al. |
| 2006/0001138 A1 | 1/2006 | Sakama et al. |
| 2006/0044192 A1 | 3/2006 | Egbert |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0145872 A1 | 7/2006 | Tanaka et al. |
| 2006/0158380 A1 | 7/2006 | Son et al. |
| 2006/0170606 A1 | 8/2006 | Yamagajo et al. |
| 2006/0214801 A1 | 9/2006 | Murofushi et al. |
| 2006/0220871 A1 | 10/2006 | Baba et al. |
| 2006/0244676 A1 | 11/2006 | Uesaka |
| 2006/0267138 A1 | 11/2006 | Kobayashi |
| 2007/0004028 A1 | 1/2007 | Lair et al. |
| 2007/0018893 A1 | 1/2007 | Kai et al. |
| 2007/0040028 A1 | 2/2007 | Kawamata |
| 2007/0052613 A1 | 3/2007 | Gallschuetz et al. |
| 2007/0057854 A1 | 3/2007 | Oodachi et al. |
| 2007/0069037 A1 | 3/2007 | Kawai |
| 2007/0132591 A1 | 6/2007 | Khatri |
| 2007/0139290 A1 * | 6/2007 | Song et al. .................. 343/860 |
| 2007/0164414 A1 | 7/2007 | Dokai et al. |
| 2007/0200782 A1 | 8/2007 | Hayama et al. |
| 2007/0252700 A1 | 11/2007 | Ishihara et al. |
| 2007/0252703 A1 | 11/2007 | Kato et al. |
| 2007/0285335 A1 | 12/2007 | Bungo et al. |
| 2007/0290928 A1 | 12/2007 | Chang et al. |
| 2008/0024156 A1 | 1/2008 | Arai et al. |
| 2008/0087990 A1 | 4/2008 | Kato et al. |
| 2008/0169905 A1 | 7/2008 | Slatter |
| 2008/0272885 A1 | 11/2008 | Atherton |
| 2009/0002130 A1 | 1/2009 | Kato |
| 2009/0009007 A1 | 1/2009 | Kato et al. |
| 2009/0065594 A1 | 3/2009 | Kato et al. |
| 2009/0109102 A1 | 4/2009 | Dokai et al. |
| 2009/0160719 A1 | 6/2009 | Kato et al. |
| 2009/0231106 A1 | 9/2009 | Okamura |
| 2009/0262041 A1 | 10/2009 | Ikemoto et al. |

FOREIGN PATENT DOCUMENTS

| | | |
|---|---|---|
| EP | 0 694 874 A2 | 1/1996 |
| EP | 0 977 145 A2 | 2/2000 |
| EP | 1 010 543 A1 | 6/2000 |
| EP | 1 160 915 A2 | 12/2001 |
| EP | 1 170 795 A2 | 1/2002 |
| EP | 1 227 540 A1 | 7/2002 |
| EP | 1 280 232 A1 | 1/2003 |
| EP | 1 280 350 A1 | 1/2003 |
| EP | 1 343 223 A1 | 9/2003 |
| EP | 1 357 511 A2 | 10/2003 |
| EP | 1 548 872 A1 | 6/2005 |
| EP | 1 703 589 A1 | 9/2006 |
| EP | 1 841 005 A1 | 10/2007 |
| EP | 2 009 738 A1 | 12/2008 |
| EP | 2 148 449 A1 | 1/2010 |
| GB | 2 305 075 A | 3/1997 |
| JE | 2003-099720 A | 4/2003 |
| JE | 2006-302219 A | 11/2006 |
| JM | 2005-210676 A | 8/2005 |
| JP | 50-143451 A | 11/1975 |
| JP | 62-127140 U | 8/1987 |
| JP | 02-164105 A | 6/1990 |
| JP | 03-262313 A | 11/1991 |
| JP | 04-150011 A | 5/1992 |
| JP | 04-167500 A | 6/1992 |
| JP | 05-327331 A | 12/1993 |
| JP | 6-53733 A | 2/1994 |
| JP | 06-077729 A | 3/1994 |
| JP | 06-177635 A | 6/1994 |
| JP | 6-260949 A | 9/1994 |
| JP | 07-183836 A | 7/1995 |
| JP | 08-056113 A | 2/1996 |
| JP | 8-87580 A | 4/1996 |
| JP | 08-088586 A | 4/1996 |
| JP | 11-149537 A | 6/1996 |
| JP | 08-176421 A | 7/1996 |
| JP | 08-180160 A | 7/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-035025 A | 2/1997 |
| JP | 9-93029 A | 4/1997 |
| JP | 09-245381 A | 9/1997 |

| | | | | | | | |
|---|---|---|---|---|---|---|---|
| JP | 09-252217 | A | 9/1997 | JP | 2002-157564 | A | 5/2002 |
| JP | 09-270623 | A | 10/1997 | JP | 2002-158529 | A | 5/2002 |
| JP | 9-512367 | A | 12/1997 | JP | 2002-175508 | A | 6/2002 |
| JP | 10-69533 | A | 3/1998 | JP | 2002-183690 | A | 6/2002 |
| JP | 10-069533 | A | 3/1998 | JP | 2002-185358 | A | 6/2002 |
| JP | 10-505466 | A | 5/1998 | JP | 2002-204117 | A | 7/2002 |
| JP | 10-171954 | A | 6/1998 | JP | 2002-522849 | A | 7/2002 |
| JP | 10-193849 | A | 7/1998 | JP | 2002-230128 | A | 8/2002 |
| JP | 10-193851 | A | 7/1998 | JP | 2002-232221 | A | 8/2002 |
| JP | 10-293828 | A | 11/1998 | JP | 2002-252117 | A | 9/2002 |
| JP | 11-039441 | A | 2/1999 | JP | 2002-259934 | A | 9/2002 |
| JP | 11-075329 | A | 3/1999 | JP | 2002-280821 | A | 9/2002 |
| JP | 11-085937 | A | 3/1999 | JP | 2002-298109 | A | 10/2002 |
| JP | 11-88241 | A | 3/1999 | JP | 2002-308437 | A | 10/2002 |
| JP | 11-102424 | A | 4/1999 | JP | 2002-319008 | A | 10/2002 |
| JP | 11-103209 | A | 4/1999 | JP | 2002-319009 | A | 10/2002 |
| JP | 11-149536 | A | 6/1999 | JP | 2002-319812 | A | 10/2002 |
| JP | 11-149538 | A | 6/1999 | JP | 2002-362613 | A | 12/2002 |
| JP | 11-219420 | A | 8/1999 | JP | 2002-373029 | A | 12/2002 |
| JP | 11-220319 | A | 8/1999 | JP | 2002-373323 | A | 12/2002 |
| JP | 11-328352 | A | 11/1999 | JP | 2002-374139 | A | 12/2002 |
| JP | 11-346114 | A | 12/1999 | JP | 2003-006599 | A | 1/2003 |
| JP | 11-515094 | A | 12/1999 | JP | 2003-016412 | A | 1/2003 |
| JP | 2000-21128 | A | 1/2000 | JP | 2003-026177 | A | 1/2003 |
| JP | 2000-021639 | A | 1/2000 | JP | 2003-030612 | A | 1/2003 |
| JP | 2000-022421 | A | 1/2000 | JP | 2003-44789 | A | 2/2003 |
| JP | 2005-229474 | A | 1/2000 | JP | 2003-046318 | A | 2/2003 |
| JP | 2000-059260 | A | 2/2000 | JP | 2003-58840 | A | 2/2003 |
| JP | 2000-085283 | A | 3/2000 | JP | 2003-067711 | A | 3/2003 |
| JP | 2000-090207 | A | 3/2000 | JP | 2003-069335 | A | 3/2003 |
| JP | 2000-132643 | A | 5/2000 | JP | 2003-076947 | A | 3/2003 |
| JP | 2000-137778 | A | 5/2000 | JP | 2003-76963 | A | 3/2003 |
| JP | 2000-137779 | A | 5/2000 | JP | 2003-78333 | A | 3/2003 |
| JP | 2000-137785 | A | 5/2000 | JP | 2003-078336 | A | 3/2003 |
| JP | 2000-148948 | A | 5/2000 | JP | 2003-085501 | A | 3/2003 |
| JP | 2000-172812 | A | 6/2000 | JP | 2003-085520 | A | 3/2003 |
| JP | 2000-209013 | A | 7/2000 | JP | 2003-87008 | A | 3/2003 |
| JP | 2000-222540 | A | 8/2000 | JP | 2003-87044 | A | 3/2003 |
| JP | 2000-510271 | A | 8/2000 | JP | 2003-099721 | A | 4/2003 |
| JP | 2000-242754 | A | 9/2000 | JP | 2003-110344 | A | 4/2003 |
| JP | 2000-243797 | A | 9/2000 | JP | 2003-132330 | A | 5/2003 |
| JP | 2000-251049 | A | 9/2000 | JP | 2003-134007 | A | 5/2003 |
| JP | 2000-261230 | A | 9/2000 | JP | 2003-155062 | A | 5/2003 |
| JP | 2000-276569 | A | 10/2000 | JP | 2003-158414 | A | 5/2003 |
| JP | 2000-286634 | A | 10/2000 | JP | 2003-168760 | A | 6/2003 |
| JP | 2000-286760 | A | 10/2000 | JP | 2003-179565 | A | 6/2003 |
| JP | 2000-311226 | A | 11/2000 | JP | 2003-187207 | A | 7/2003 |
| JP | 2000-321984 | A | 11/2000 | JP | 2003-187211 | A | 7/2003 |
| JP | 3075400 | U | 11/2000 | JP | 2003-188338 | A | 7/2003 |
| JP | 2000-349680 | A | 12/2000 | JP | 2003-188620 | A | 7/2003 |
| JP | 2001-10264 | A | 1/2001 | JP | 2003-198230 | A | 7/2003 |
| JP | 2001-028036 | A | 1/2001 | JP | 2003-209421 | A | 7/2003 |
| JP | 2007-18067 | A | 1/2001 | JP | 2003-216919 | A | 7/2003 |
| JP | 2001-043340 | A | 2/2001 | JP | 2003-218624 | A | 7/2003 |
| JP | 2001-66990 | A | 3/2001 | JP | 2003-233780 | A | 8/2003 |
| JP | 2001-76111 | A | 3/2001 | JP | 2003-242471 | A | 8/2003 |
| JP | 2001-505682 | A | 4/2001 | JP | 2003-243918 | A | 8/2003 |
| JP | 2001-168628 | A | 6/2001 | JP | 2003-249813 | A | 9/2003 |
| JP | 2001-188890 | A | 7/2001 | JP | 2003-529163 | A | 9/2003 |
| JP | 2001-240046 | A | 9/2001 | JP | 2003-288560 | A | 10/2003 |
| JP | 2001-256457 | A | 9/2001 | JP | 2003-309418 | A | 10/2003 |
| JP | 2001-257292 | A | 9/2001 | JP | 2003-317060 | A | 11/2003 |
| JP | 2001-514777 | A | 9/2001 | JP | 2003-331246 | A | 11/2003 |
| JP | 2001-319380 | A | 11/2001 | JP | 2003-332820 | A | 11/2003 |
| JP | 2001-331976 | A | 11/2001 | JP | 2003-536302 | A | 12/2003 |
| JP | 2001-332923 | | 11/2001 | JP | 2004-040597 | A | 2/2004 |
| JP | 2001-339226 | A | 12/2001 | JP | 2004-505481 | A | 2/2004 |
| JP | 2001-344574 | A | 12/2001 | JP | 2004-082775 | A | 3/2004 |
| JP | 2001-351084 | A | 12/2001 | JP | 2004-88218 | A | 3/2004 |
| JP | 2001-352176 | A | 12/2001 | JP | 2004-93693 | A | 3/2004 |
| JP | 2002-024776 | A | 1/2002 | JP | 2004-096566 | A | 3/2004 |
| JP | 2002-026513 | A | 1/2002 | JP | 2004-127230 | A | 4/2004 |
| JP | 2002-32731 | A | 1/2002 | JP | 2004-213582 | A | 7/2004 |
| JP | 2002-042076 | A | 2/2002 | JP | 2004-519916 | A | 7/2004 |
| JP | 2002-063557 | A | 2/2002 | JP | 2004-234595 | A | 8/2004 |
| JP | 2002-505645 | A | 2/2002 | JP | 2004-253858 | A | 9/2004 |
| JP | 2002-076750 | A | 3/2002 | JP | 2004-527864 | A | 9/2004 |
| JP | 2002-76750 | A | 3/2002 | JP | 2004-280390 | A | 10/2004 |
| JP | 2002-150245 | A | 5/2002 | JP | 2004-287767 | A | 10/2004 |

| | | | | | | |
|---|---|---|---|---|---|---|
| JP | 2004-297249 A | 10/2004 | | JP | 2007-122542 A | 5/2007 |
| JP | 2004-297681 A | 10/2004 | | JP | 2007-150642 A | 6/2007 |
| JP | 2004-319848 A | 11/2004 | | JP | 2007-150868 A | 6/2007 |
| JP | 2004-326380 A | 11/2004 | | JP | 2007-159083 A | 6/2007 |
| JP | 2004-334268 A | 11/2004 | | JP | 2007-159129 A | 6/2007 |
| JP | 2004-336250 A | 11/2004 | | JP | 2007-228325 A | 9/2007 |
| JP | 2004-343000 A | 12/2004 | | JP | 2007-266999 A | 10/2007 |
| JP | 2004-362190 A | 12/2004 | | JP | 2007-287128 A | 11/2007 |
| JP | 2004-362341 A | 12/2004 | | JP | 2007-312350 A | 11/2007 |
| JP | 2004-362602 A | 12/2004 | | JP | 2008-72243 A | 3/2008 |
| JP | 2005-5866 A | 1/2005 | | JP | 4069958 B2 | 4/2008 |
| JP | 2005-18156 A | 1/2005 | | JP | 2008-519347 A | 6/2008 |
| JP | 2005-124061 A | 5/2005 | | JP | 2008-160874 A | 7/2008 |
| JP | 2005-128592 A | 5/2005 | | JP | 11-175678 A | 1/2009 |
| JP | 2005-129019 A | 5/2005 | | JP | 2009-25870 A | 2/2009 |
| JP | 2005-135132 A | 5/2005 | | JP | 2009-27291 A | 2/2009 |
| JP | 2005-136528 A | 5/2005 | | NL | 9100176 A | 3/1992 |
| JP | 2005-137032 A | 5/2005 | | NL | 9100347 A | 3/1992 |
| JP | 3653099 B2 | 5/2005 | | WO | 99/67754 A1 | 12/1999 |
| JP | 2005-165839 A | 6/2005 | | WO | 00/10122 A2 | 2/2000 |
| JP | 2005-167327 A | 6/2005 | | WO | 01/95242 A2 | 12/2001 |
| JP | 2005-167813 A | 6/2005 | | WO | 02/061675 A1 | 8/2002 |
| JP | 2005-190417 A | 7/2005 | | WO | 02/097723 A1 | 12/2002 |
| JP | 2005-191705 A | 7/2005 | | WO | 03/079305 A1 | 9/2003 |
| JP | 2005-210680 A | 8/2005 | | WO | 2004/036772 A1 | 4/2004 |
| JP | 2005-217822 A | 8/2005 | | WO | 2004/070879 A | 8/2004 |
| JP | 2005-236339 A | 9/2005 | | WO | 2004/072892 A1 | 8/2004 |
| JP | 2005-244778 A | 9/2005 | | WO | 2005/073937 A | 8/2005 |
| JP | 2005-252853 A | 9/2005 | | WO | 2005/115849 A1 | 12/2005 |
| JP | 2005-275870 A | 10/2005 | | WO | 2006/045682 A | 5/2006 |
| JP | 2005-284352 A | 10/2005 | | WO | 2006/048663 A1 | 5/2006 |
| JP | 2005-293537 A | 10/2005 | | WO | 2007/083574 A1 | 7/2007 |
| JP | 2005-295135 A | 10/2005 | | WO | 2007/083575 A1 | 7/2007 |
| JP | 2005-311205 A | 11/2005 | | WO | 2007/086130 A1 | 8/2007 |
| JP | 2005-321305 A | 11/2005 | | WO | 2007/119310 A1 | 10/2007 |
| JP | 2005-322119 A | 11/2005 | | WO | 2007/125683 A1 | 11/2007 |
| JP | 2005-335755 A | 12/2005 | | WO | 2007/138857 A1 | 12/2007 |
| JP | 2005-345802 A | 12/2005 | | WO | 2008/007606 A | 1/2008 |
| JP | 2005-346820 A | 12/2005 | | WO | 2008/140037 A1 | 11/2008 |
| JP | 2005-352858 A | 12/2005 | | WO | 2009/011376 A1 | 1/2009 |
| JP | 2006-025390 A | 1/2006 | | WO | 2009/081719 A1 | 7/2009 |
| JP | 2006-031766 A | 2/2006 | | | | |
| JP | 2006-39902 A | 2/2006 | | | | |
| JP | 2006-42059 A | 2/2006 | | | | |
| JP | 2006-42097 A | 2/2006 | | | | |
| JP | 2006-67479 A | 3/2006 | | | | |
| JP | 2006-72706 A | 3/2006 | | | | |
| JP | 2006-80367 A | 3/2006 | | | | |
| JP | 2006-92630 A | 4/2006 | | | | |
| JP | 2006-102953 A | 4/2006 | | | | |
| JP | 2006-107296 A | 4/2006 | | | | |
| JP | 2006-513594 A | 4/2006 | | | | |
| JP | 2006-148518 A | 6/2006 | | | | |
| JP | 2006-151402 A | 6/2006 | | | | |
| JP | 2006-174151 A | 6/2006 | | | | |
| JP | 2006-195795 A | 7/2006 | | | | |
| JP | 2006-203187 A | 8/2006 | | | | |
| JP | 2006-203852 A | 8/2006 | | | | |
| JP | 2006-217000 A | 8/2006 | | | | |
| JP | 2006-232292 A | 9/2006 | | | | |
| JP | 2006-237674 A | 9/2006 | | | | |
| JP | 2006-270212 A | 10/2006 | | | | |
| JP | 2006-270766 A | 10/2006 | | | | |
| JP | 2006-285911 A | 10/2006 | | | | |
| JP | 2006-295879 A | 10/2006 | | | | |
| JP | 2006-309401 A | 11/2006 | | | | |
| JP | 2006-311239 A | 11/2006 | | | | |
| JP | 2006-323481 A | 11/2006 | | | | |
| JP | 2006-339964 A | 12/2006 | | | | |
| JP | 2007-007888 A | 1/2007 | | | | |
| JP | 2007-13120 A | 1/2007 | | | | |
| JP | 2007-28002 A | 2/2007 | | | | |
| JP | 2007-043535 A | 2/2007 | | | | |
| JP | 2007-048126 A | 2/2007 | | | | |
| JP | 2007-65822 A | 3/2007 | | | | |
| JP | 2007-79687 A | 3/2007 | | | | |
| JP | 2007-81712 A | 3/2007 | | | | |
| JP | 2007-096768 A | 4/2007 | | | | |
| JP | 2007-102348 A | 4/2007 | | | | |

OTHER PUBLICATIONS

English translation of NL9100347, published on Mar. 2, 1992.
Kato et al.: "Antenna"; U.S. Appl. No. 11/928,502, filed Oct. 30, 2007.
Kato et al.: "Wireless IC Device"; U.S. Appl. No. 12/211,117, filed Sep. 16, 2008.
Kato et al.: "Antenna"; U.S. Appl. No. 11/688,290, filed Mar. 20, 2007.
Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Device and Component for Wireless IC Device"; U.S. Appl. No. 12/339,198, filed Dec. 19, 2008.
Ikemoto et al.: "Wireless IC Device"; U.S. Appl. No. 11/851,651, filed Sep. 7, 2007.
Kataya et al.: "Wireless IC Device and Electronic Device"; U.S. Appl. No. 11/851,661, filed Sep. 7, 2007.

Dokai et al.: "Antenna and Radio IC Device"; U.S. Appl. No. 12/350,307, filed Jan. 8, 2009.
Official Communication issued in International Patent Application No. PCT/JP2008/063025, mailed on Aug. 12, 2008.
Kato et al.: "Wireless IC Device," U.S. Appl. No. 12/603,608, filed Oct. 22, 2009.
Kato et al.: "Wireless IC Device," U.S. Appl. No. 12/688,072, filed Jan. 15, 2010.
Official Communication issued in International Patent Application No. PCT/JP2009/053693, mailed on Jun. 9, 2009.
Kato: "Composite Antenna," U.S. Appl. No. 12/845,846, filed Jul. 29, 2010.
Official Communication issued in International Patent Application No. PCT/JP2009/053690, mailed on Jun. 2, 2009.
Kato et al.: "Radio Frequency IC Device and Radio Communication System," U.S. Appl. No. 12/859,340, filed Aug. 19, 2010.
Official Communication issued in International Patent Application No. PCT/JP2009/055758, mailed on Jun. 23, 2009.
Kato et al.: "Wireless IC Device," U.S. Appl. No. 12/859,880, filed Aug. 20, 2010.
Official Communication issued in International Patent Application No. PCT/JP2009/057482, mailed on Jul. 21, 2009.
Kataya et al.: "Wireless IC Device, Electronic Apparatus, and Method for Adjusting Resonant Frequency of Wireless IC Device," U.S. Appl. No. 12/861,945, filed Aug. 24, 2010.
Kato: "Wireless IC Device and Electromagnetic Coupling Module," U.S. Appl. No. 12/890,895, filed Sep. 27, 2010.
Official Communication issued in International Patent Application No. PCT/JP2009/059410, mailed on Aug. 4, 2009.
Kato et al.: "Wireless IC Device" U.S. Appl. No. 12/902,174, filed Oct. 12, 2010.
Official Communication issued in International Patent Application No. PCT/JP2009/059259, mailed on Aug. 11, 2009.
Official Communication issued in corresponding Japanese Patent Application No. 2010-506742, mailed on Apr. 6, 2010.
Official Communication issued in International Patent Application No. PCT/JP2009/056698, mailed on Jul. 7, 2009.
Official Communication issued in corresponding Chinese Patent Application No. 200880002209.4, mailed on Aug. 31, 2011.
Official communication issued in Japanese Application No. 2007-531524, mailed on Sep. 11, 2007.
Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags"), RFID, pp. 112-126.
Dokai et al.: "Wireless IC Device and Component for Wireless IC Device"; U.S. Appl. No. 11/624,382, filed Jan. 18, 2007.
Dokai et al.: "Wireless IC Device, and Component for Wireless IC Device"; U.S. Appl. No. 11/930,818, filed Oct. 31, 2007.
Kato et al.: "Wireless IC Device"; U.S. Appl. No. 12/042,399, filed Mar. 5, 2008.
Official communication issued in related U.S. Appl. No. 12/042,399; mailed on Aug. 25, 2008.
Official Communication issued in International Application No. PCT/JP2007/066007, mailed on Nov. 27, 2007.
Dokai et al.: "Wireless IC Device and Component for Wireless IC Device"; U.S. Appl. No. 12/359,690, filed Jan. 26, 2009.
Dokai et al.: "Test System for Radio Frequency IC Devices and Method of Manufacturing Radio Frequency IC Devices Using the Same"; U.S. Appl. No. 12/388,826, filed Feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; U.S. Appl. No. 12/390,556, filed Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, mailed on May 1, 2008.
Kato et al.: "Article Having Electromagnetic Coupling Module Attached Thereto"; U.S. Appl. No. 12/401,767, filed Mar. 11, 2009.
Taniguchi et al.: "Antenna Device and Radio Frequency IC Device"; U.S. Appl. No. 12/326,117, filed Dec. 2, 2008.
Official Communication issued in International Patent Application No. PCT/JP2008/061442, mailed on Jul. 22, 2008.
Kato et al.: "Container With Electromagnetic Coupling Module"; U.S. Appl. No. 12/426,369, filed Apr. 20, 2009.
Kato: "Wireless IC Device"; U.S. Appl. No. 12/429,346, filed Apr. 24, 2009.
Official communication issued in counterpart European Application No. 08 77 7758, dated on Jun. 30, 2009.
Official communication issued in counterpart Japanese Application No. 2008-103741, mailed on May 26, 2009.
Official communication issued in counterpart Japanese Application No. 2008-103742, mailed on May 26, 2009.
Official communication issued in International Application No. PCT/JP2008/050358, mailed on Mar. 25, 2008.
Official communication issued in International Application No. PCT/JP2008/050356, mailed on Mar. 25, 2008.
Osamura et al.: "Packaging Material With Electromagnetic Coupling Module," U.S. Appl. No. 12/536,663, filed Aug. 6, 2009.
Osamura et al.: "Packaging Material With Electromagnetic Coupling Module," U.S. Appl. No. 12/536,669, filed Aug. 6, 2009.
Dokai et al.: "Wireless IC Device and Component for Wireless IC Device," U.S. Appl. No. 12/543,553, filed Aug. 19, 2009.
Shioya et al.: "Wireless IC Device," U.S. Appl. No. 12/551,037, filed Aug. 31, 2009.
Ikemoto: "Wireless IC Device and Manufacturing Method Thereof," U.S. Appl. No. 12/579,672, filed Oct. 15, 2009.
Official communication issued in International Application No. PCT/JP2008/058614, mailed on Jun. 10, 2008.
Official Communication issued in International Patent Application No. PCT/JP2009/056934, mailed on Jun. 30, 2009.
Kato et al.: "Wireless IC Device"; U.S. Appl. No. 12/903,242, filed Oct. 13, 2010.
Kato et al.: "Wireless IC Device"; U.S. Appl. No. 12/940,103, filed Nov. 5, 2010.
Kato et al.: "Wireless IC Device System and Method of Determining Authenticity of Wireless IC Device"; U.S. Appl. No. 12/940,105, filed Nov. 5, 2010.
Official Communication issued in International Patent Application No. PCT/JP2009/059669, mailed on Aug. 25, 2009.
Official Communication issued in International Patent Application No. PCT/JP2009/062181, mailed on Oct. 13, 2009.
Official Communication issued in corresponding Japanese Application No. 2010-501323, mailed on Apr. 6, 2010.
Kato et al.: "Component of Wireless IC Device and Wireless IC Device"; U.S. Appl. No. 12/944,099, filed Nov. 11, 2010.
Kato et al.: Wireless IC Device and Manufacturing Method Thereof; U.S. Appl. No. 12/961,599, filed Dec. 7, 2010.
Kataya et al.: "Radio Frequency IC Device and Electronic Apparatus"; U.S. Appl. No. 12/959,454, filed Dec. 3, 2010.
Ikemoto et al.: Radio IC Device; U.S. Appl. No. 12/981,582, filed Dec. 30, 2010.
Ikemoto et al.: Wireless IC Device and Electronic Apparatus; U.S. Appl. No. 13/022,693, filed Feb. 8, 2011.
Official communication issued in counterpart International Application No. PCT/JP2008/071502, mailed Feb. 24, 2009.
Kato et al.: "Wireless IC Device and Manufacturing Method Thereof," U.S. Appl. No. 12/432,854, filed Apr. 30, 2009.
Official communication issued in counterpart International Application No. PCT/JP2008/058168, mailed Aug. 12, 2008.
Official communication issued in counterpart International Application No. PCT/JP2008/062886, mailed Oct. 21, 2008.
Kato et al.: "Wireless IC Device," U.S. Appl. No. 12/469,896, filed May 21, 2009.
Ikemoto et al.: "Wireless IC Device," U.S. Appl. No. 12/496,709, filed Jul. 2, 2009.

Official communication issued in counterpart International Application No. PCT/JP2008/062947, mailed Aug. 19, 2008.
Official communication issued in counterpart International Application No. PCT/JP2008/056026, mailed Jul. 1, 2008.
Ikemoto et al.: "Wireless IC Device and Electronic Apparatus," U.S. Appl. No. 12/503,188, filed Jul. 15, 2009.
Official communication issued in counterpart International Application No. PCT/JP2008/055567, mailed May 20, 2008.
Official communication issued in counterpart International Application No. PCT/JP2008/051853, mailed Apr. 22, 2008.
Official communication issued in counterpart International Application No. PCT/JP2008/057239, mailed Jul. 22, 2008.

Kimura et al.: "Wireless IC Device," U.S. Appl. No. 12/510,338, filed Jul. 28, 2009.
Kato et al.: "Wireless IC Device," U.S. Appl. No. 12/510,340, filed Jul. 28, 2009.
Kato: "Wireless IC Device," U.S. Appl. No. 12/510,344, filed Jul. 28, 2009.
Kato et al.: "Wireless IC Device," U.S. Appl. No. 12/510,347, filed Jul. 28, 2009.
Official Communication issued in corresponding Chinese Patent Application No. 200880002209.4, mailed on Dec. 5, 2011.

* cited by examiner

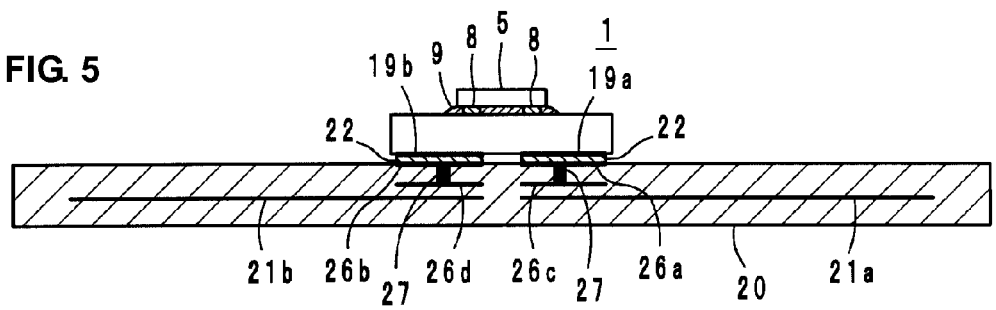
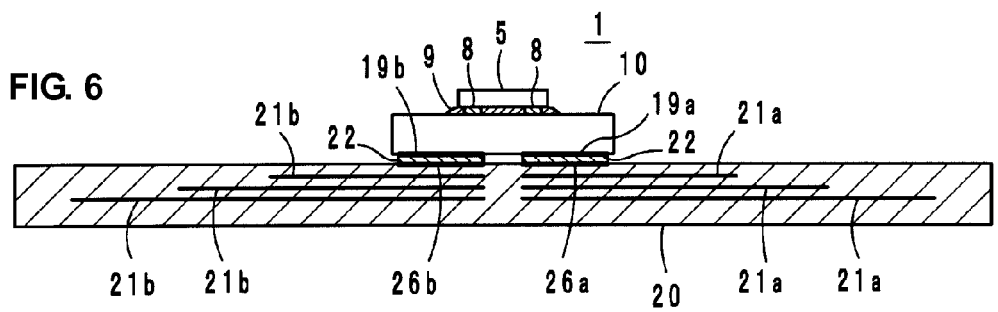
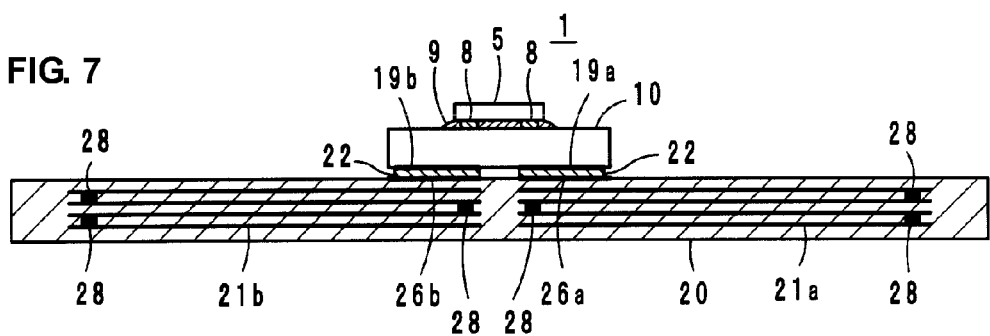
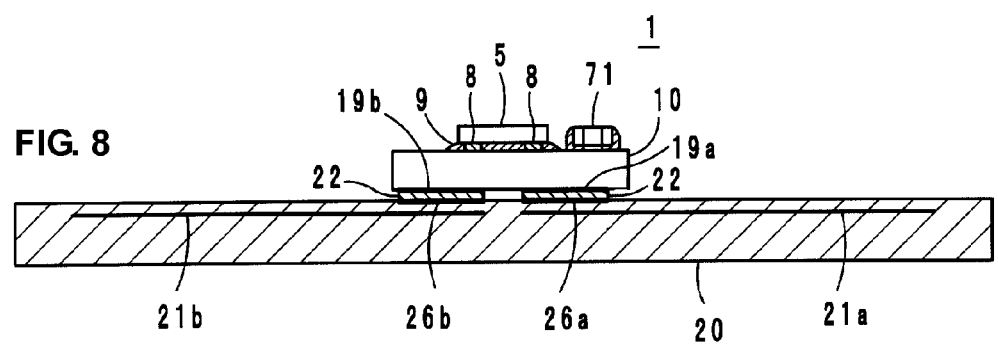

WIRELESS IC DEVICE AND ELECTRONIC APPARATUS

BACKGROUND OF THE INVENTION

1. Field of the Invention

The present invention relates to a wireless IC device and, more particularly, to a wireless IC device that has a wireless IC used in an RFID (Radio Frequency Identification) system, and an electronic apparatus.

2. Description of the Related Art

In recent years, an RFID system has been developed as an article management system, which includes a reader/writer that generates an induction field and an IC chip (also referred to as IC tag or wireless IC chip) that stores predetermined information allocated to an article or a casing, and non-contact communication is established between the reader/writer and the IC chip to transmit the information therebetween.

A known existing wireless IC device equipped with an IC chip includes a wireless IC tag as described in Japanese Unexamined Patent Application Publication No. 2005-244778. In the wireless IC tag, a dipole antenna (formed of a pair of main antenna elements and matching sections) is provided on a dielectric substrate, and a tag IC is electrically connected to an end portion of the dipole antenna. The matching section is arranged between the tag IC and each main antenna element and has the function of matching impedance therebetween.

However, the above wireless IC tag has the following problems. First, because each matching section and the corresponding main antenna element are formed adjacent to each other on a single substrate, the size of the wireless IC tag increases. Second, it is necessary to mount a small wireless IC chip on an electrode formed on a large substrate on which the main antenna elements and the matching sections are arranged, so a highly accurate mounter is required. In addition, it requires time for positioning at the time of mounting, so manufacturing time is increased, and cost for the wireless IC tag increases. Third, because the main antenna elements and the wireless IC chip are connected in an electrically conductive state, so there is a possibility that the wireless IC chip may be damaged when static electricity enters from the main antenna elements.

In addition, Japanese Unexamined Patent Application Publication No. 2000-311226 describes a wireless IC card. The wireless IC card uses an IC chip in which an antenna coil is formed on the surface of the IC chip. In the above wireless IC card, a first antenna coil formed on the IC chip is coupled to a second antenna coil formed on a module substrate through a magnetic field.

However, in the wireless IC card described in Japanese Unexamined Patent Application Publication No. 2000-311226, it is necessary to accurately control the interval between the first and second antenna coils to a size at which a desired coupling is achieved. Specifically, as described in the paragraph [0107] of Japanese Unexamined Patent Application Publication No. 2000-311226, it is necessary to set the interval to a smaller interval that is smaller than or equal to 20 µm. When the two antenna coils are coupled with the above small interval, there is a problem that slight variations in the amount or dielectric constant of insulating adhesive arranged between the two antenna coils and in between each antenna coil vary a coupled state and, therefore, the radiation characteristic of the wireless IC card decreases. In addition, in order to mount the IC chip on the module substrate at a small interval with high accuracy, it requires an expensive mounter, and, as a result, cost for the wireless IC card increases.

SUMMARY OF THE INVENTION

In view of the above, preferred embodiments of the present invention provide a wireless IC device that can achieve miniaturization, allows simple and low-cost mounting of a wireless IC, and eliminates the possibility of any damage occurring to the wireless IC due to static electricity, and provide an electronic apparatus equipped including such a novel wireless IC device.

In addition, preferred embodiments of the present invention provide a wireless IC device that achieves the advantages of the preferred embodiments described in the preceding paragraph and is able to withstand against an impact due to a drop, or the like, and a stress due to heat shrinkage, and to provide an electronic apparatus including the novel IC device.

A wireless IC device according to a preferred embodiment of the present invention includes: a wireless IC that processes transmission and reception signals; a feeder circuit substrate including a feeder circuit incorporating an inductance element connected to the wireless IC in a galvanically conductive state and in which a feeder electrode coupled to the inductance element is provided on a surface of the substrate or an inside of the substrate; and a radiation plate that is electromagnetically coupled to the feeder electrode.

In the above wireless IC device, the feeder electrode provided on the surface or inside of the feeder circuit substrate is coupled to the inductance element provided for the feeder circuit substrate and is electromagnetically coupled to the radiation plate that functions as an antenna. It is not necessary that the feeder circuit substrate is equipped with a radiation plate having a relatively large size. Thus, the feeder circuit substrate may be exceedingly miniaturized. It is only necessary that the wireless IC is mounted on the above small feeder circuit substrate. An IC mounter, or the like, used widely in the existing art may be used, so mounting cost reduces. In addition, when the wireless IC is changed in response to the frequency used in an RFID system, it is only necessary to change the design of a resonant circuit and/or matching circuit of the feeder circuit substrate, and it is not necessary to change the shape or size of the radiation plate. In terms of this point as well, it is possible to achieve low cost.

Particularly, one of the unique features of the wireless IC device according to the present preferred embodiment is that the feeder electrode is provided for the feeder circuit substrate, and the feeder electrode is coupled to the inductance element and is electromagnetically coupled to the radiation plate. The inductance element is in a galvanically conductive state with the wireless IC; and, when the radiation plate and the feeder electrode are in a galvanically non-conductive state, it is possible to prevent any damage occurring to the wireless IC due to static electricity that enters from the radiation plate.

Note that the wireless IC may be in chip form, and the wireless IC may be able to rewrite information or may have an information processing function other than the RFID system in addition to storing various pieces of information regarding an article to which the wireless IC device is attached.

Another preferred embodiment of the present invention provides an electronic apparatus that includes the above wireless IC device. The radiation plate is provided for a printed wiring board incorporated in an apparatus casing, and the feeder electrode provided for the feeder circuit substrate is electromagnetically coupled to the radiation plate.

According to various preferred embodiments of the present invention, it is not necessary that the feeder circuit substrate is equipped with a radiation plate having a relatively large size, so the feeder circuit substrate may be exceedingly miniaturized. Therefore, a small wireless IC may also be easily mounted using an existing mounter. Thus, mounting cost reduces. To change a frequency band used, it is only necessary to change the design of the resonant circuit. In addition, the feeder electrode provided for the feeder circuit substrate is electromagnetically coupled to the radiation plate. This eliminates the possibility that the wireless IC is damaged because of static electricity that enters from the radiation plate. In addition, because the radiation plate does not sustain any damage due to a bonding material, such as solder, mechanical reliability is greatly improved.

In addition, by providing the mounting electrode on the surface of the feeder circuit substrate separately from the feeder electrode, the bonding strength of the feeder circuit substrate is greatly improved. Thus, even when the wireless IC device receives an impact because of a drop, or the like, or when thermal stress is applied to the radiation substrate or the feeder circuit substrate, it does not adversely influence electromagnetic coupling between the feeder electrode and the radiation plate.

Particularly, the mounting electrode provided on the side surface of the feeder circuit substrate is fixed to a mounting land different from the radiation plate. Thus, the feeder circuit substrate and the radiation plate are desirably coupled to each other through a simple manufacturing process without variations in gap therebetween, and variations in degree of coupling are substantially eliminated.

Other features, elements, arrangements, steps, characteristics and advantages of the present invention will become more apparent from the following detailed description of preferred embodiments of the present invention with reference to the attached drawings.

BRIEF DESCRIPTION OF THE DRAWINGS

FIG. 5 is a cross-sectional view of a wireless IC device according to a fifth preferred embodiment of the present invention.

FIG. 6 is a cross-sectional view of a wireless IC device according to a sixth preferred embodiment of the present invention.

FIG. 7 is a cross-sectional view of a wireless IC device according to a seventh preferred embodiment of the present invention.

FIG. 8 is a cross-sectional view of a wireless IC device according to an eighth preferred embodiment of the present invention.

FIGS. 28A and 28B show a wireless IC device according to a nineteenth preferred embodiment of the present invention, in which FIG. 28A is a cross-sectional view and FIG. 28B is a plan view of a radiation plate.

FIGS. 32A and 32B show a wireless IC device according to a twenty-third preferred embodiment of the present invention, in which FIG. 32A is a cross-sectional view of a wireless IC chip and a feeder circuit substrate and FIG. 32B is a plan view of a radiation plate.

FIGS. 37A and 37B show a wireless IC device according to a twenty-eighth preferred embodiment of the present invention, in which FIG. 37A is a cross-sectional view and FIG. 37B is a plan view of a radiation plate.

FIGS. 38A and 38B shows a wireless IC device according to a twenty-ninth preferred embodiment of the present invention, in which FIG. 38A is a cross-sectional view and FIG. 38B is a plan view of a radiation plate.

FIGS. 39A and 39B show a wireless IC device according to a thirtieth preferred embodiment of the present invention, in which FIG. 39A is a cross-sectional view and FIG. 39B is a plan view of a radiation plate.

DETAILED DESCRIPTION OF THE PREFERRED EMBODIMENTS

Figure 1:
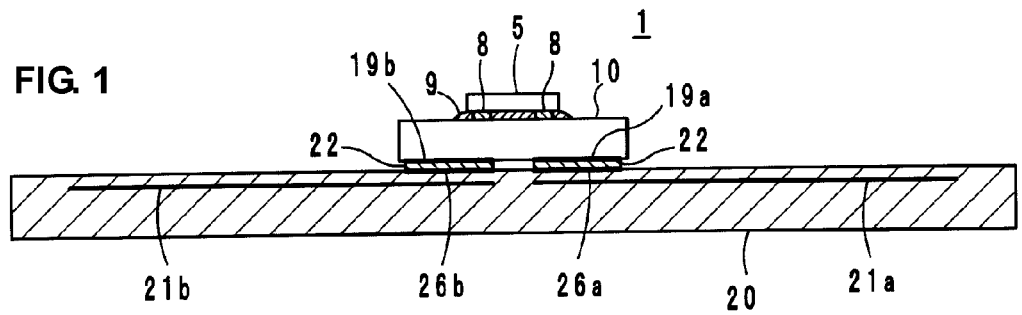
FIG. 1 is a cross-sectional view of a wireless IC device according to a first preferred embodiment of the present invention.

Hereinafter, preferred embodiments of a wireless IC device and an electronic apparatus according to the present invention will be described with reference to the accompanying drawings. Note that in the drawings, like reference numerals denote like components or portions, and the overlap description is omitted.

First Preferred Embodiment of Wireless IC Device, see FIG. 1

FIG. 1 shows a wireless IC device according to a first preferred embodiment of the present invention. The wireless IC device 1 includes a wireless IC chip 5, a feeder circuit substrate 10, and radiation plates 21a and 21b. The wireless IC chip 5 processes transmission and reception signals of a predetermined frequency. The wireless IC chip 5 is mounted on the feeder circuit substrate 10. The radiation plates 21a and 21b are provided for a radiation substrate (printed wiring board) 20.

Figure 19:
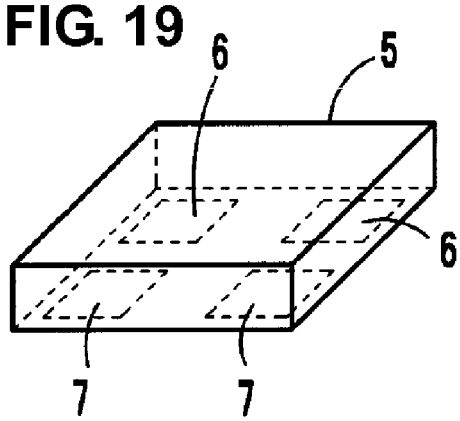
FIG. 19 is a perspective view of a wireless IC chip.

The wireless IC chip 5 preferably includes a clock circuit, a logic circuit, a memory circuit, and the like. The wireless IC chip 5 stores necessary information. As shown in FIG. 19, input/output terminal electrodes 6 and mounting terminal electrodes 7 are provided on the back surface of the wireless IC chip 5. The input/output terminal electrodes 6 are electrically connected to electrodes 12a and 12b (see FIG. 20) via metal bumps 8. The electrodes 12a and 12b are provided on the surface of the feeder circuit substrate 10. In addition, the mounting terminal electrodes 7 are electrically connected to electrodes 12c and 12d via metal bumps 8. Note that the material of each metal bump 8 may be Au, Ag, solder, or other suitable material.

In addition, a protection film 9 is arranged on the surface of the feeder circuit substrate 10 so as to cover a portion connecting with the wireless IC chip 5 in order to improve the bonding strength between the wireless IC chip 5 and the feeder circuit substrate 10.

The radiation plates 21a and 21b are arranged so that an electrode film formed of a conductive paste or metal plating such as Al, Cu and Ag is provided in a predetermined shape in the radiation substrate 20 having a multilayer structure. Electrodes 26a and 26b are provided on the surface of the radiation substrate 20. Note that the radiation substrate 20 is not limited to a printed wiring board made of glass epoxy resin but it may be formed of a resin substrate, made of another resin, or a ceramic substrate.

The feeder circuit substrate 10 incorporates a resonant circuit (not shown in FIG. 1) having an inductance element. Feeder electrodes 19a and 19b are provided on the back surface of the feeder circuit substrate 10. The connecting electrodes 12a to 12d (see FIG. 20) are disposed on the surface of the feeder circuit substrate 10. The feeder electrodes 19a and 19b are coupled to the resonant circuit incorporated in the substrate 10. In addition, the feeder electrodes 19a and 19b are connected to the electrodes 26a and 26b via conductive adhesive 22 in an electrically conductive state. The electrodes 26a and 26b are provided on the radiation substrate 20. That is, the feeder electrodes 19a and 19b are capacitively coupled to the radiation plates 21a and 21b via the electrodes 26a and 26b and the conductive adhesive 22 in an electrically non-conductive state. Note that insulating adhesive or solder may be used instead of the conductive adhesive 22. In addition, the electrodes 26a and 26b are not necessary.

The feeder circuit substrate 10 incorporates the resonant circuit having a predetermined resonant frequency. The feeder circuit substrate 10 transmits a transmission signal having a predetermined frequency, output from the wireless IC chip 5, to the radiation plates 21a and 21b via the feeder electrodes 19a and 19b, or the like, and selects a reception signal having a predetermined frequency among signals received by the radiation plates 21a and 21b and then supplies the reception signal to the wireless IC chip 5. Therefore, in the wireless IC device 1, the wireless IC chip 5 is activated by a signal received by the radiation plates 21a and 21b, and a response signal from the wireless IC chip 5 is radiated outward from the radiation plates 21a and 21b.

In the wireless IC device 1, the feeder electrodes 19a and 19b provided on the surface of the feeder circuit substrate 10 are coupled to the resonant circuit incorporated in the substrate 10, and are coupled to the radiation plates 21a and 21b, which function as an antenna, in an electrically non-conductive state. It is not necessary that the feeder circuit substrate 10 is equipped with the radiation plates 21a and 21b having a relatively large size. Thus, the feeder circuit substrate 10 may be exceedingly miniaturized. The wireless IC chip 5 may be mounted on the above small feeder circuit substrate 10. A mounter, or the like, used widely in the existing art may be used, so mounting cost is greatly reduced. In addition, to change a frequency band used, it is only necessary to change the design of the resonant circuit, and the radiation plates 21a and 21b, and the like, may be used without any change. In addition, the radiation plates 21a and 21b are in an electrically non-conductive state with the feeder electrodes 19a and 19b. Thus, static electricity that enters from the radiation plates 21a and 21b is not applied to the wireless IC chip 5. This prevents any damage occurring to the wireless IC chip 5 due to static electricity.

Figure 2:
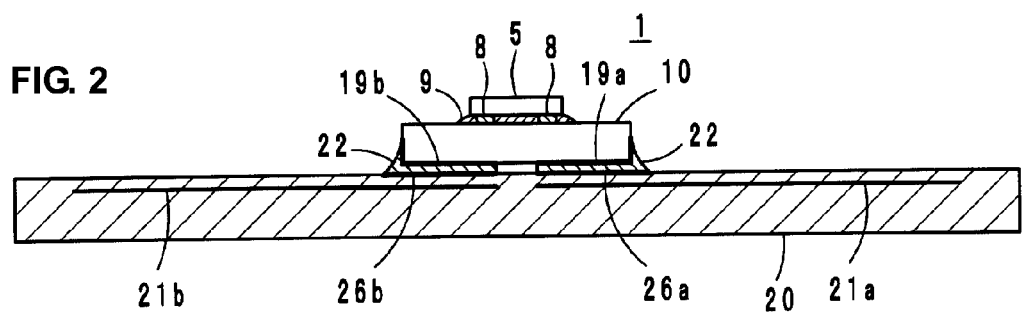
FIG. 2 is a cross-sectional view of a wireless IC device according to a second preferred embodiment of the present invention.

Second Preferred Embodiment of Wireless IC Device, see FIG. 2

FIG. 2 shows a wireless IC device according to a second preferred embodiment of the present invention. The wireless IC device 1 basically has a similar configuration to that of the first preferred embodiment. The wireless IC device 1 is constructed so that the feeder electrodes 19a and 19b are arranged over a range from the back surface of the feeder circuit substrate 10 to both side surfaces thereof. The feeder electrodes 19a and 19b are further strongly coupled to the radiation plates 21a and 21b. The other operations and advantages are similar to those of the first preferred embodiment.

Figure 3:
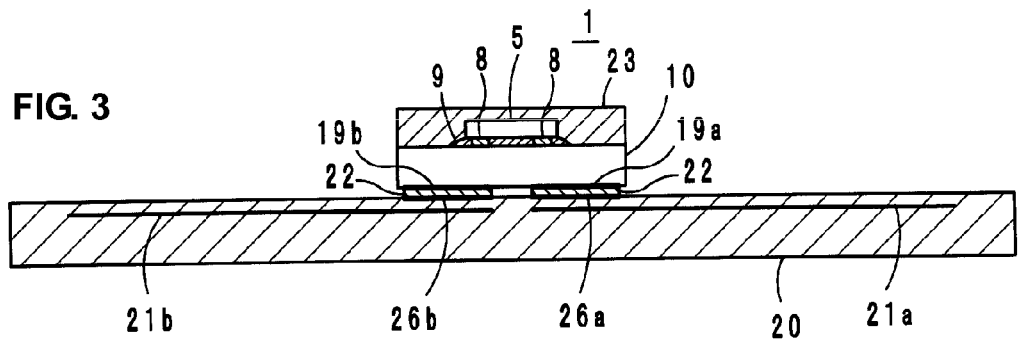
FIG. 3 is a cross-sectional view of a wireless IC device according to a third preferred embodiment of the present invention.

Third Preferred Embodiment of Wireless IC Device, see FIG. 3

FIG. 3 shows a wireless IC device according to a third preferred embodiment of the present invention. The wireless IC device 1 basically has a similar configuration to that of the first preferred embodiment. A protection film 23 made of epoxy-based resin or polyimide-based resin is arranged on the surface of the feeder circuit substrate 10 to cover the wireless IC chip 5. By providing the protection film 23, the environmental resistance improves. The other operations and advantages are similar to those of the first preferred embodiment.

Figure 4:
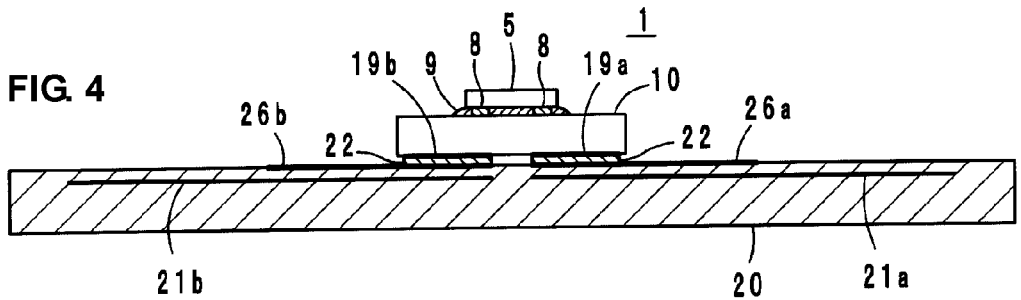
FIG. 4 is a cross-sectional view of a wireless IC device according to a fourth preferred embodiment of the present invention.

Fourth Preferred Embodiment of Wireless IC Device, see FIG. 4

FIG. 4 shows a wireless IC device according to a fourth preferred embodiment of the present invention. The wireless IC device 1 basically has a similar configuration to that of the first preferred embodiment. The wireless IC device 1 is constructed so that the electrodes 26a and 26b are extended to both sides to also function as radiation plates. The other operations and advantages are similar to those of the first preferred embodiment.

Fifth Preferred Embodiment of Wireless IC Device, see FIG. 5

FIG. 5 shows a wireless IC device according to a fifth preferred embodiment of the present invention. The wireless IC device 1 basically has a similar configuration to that of the first preferred embodiment. The wireless IC device 1 is constructed so that the multilayer radiation substrate 20 includes two layers of the radiation plates 21a and 21b and the electrodes 26c and 26d, respectively. The electrodes 26a and 26b are provided on the surface of the radiation substrate 20 and then the electrodes 26a and 26b and the electrodes 26c and 26d are respectively electrically connected through via hole conductors 27.

In the fifth preferred embodiment, the radiation plates 21a and 21b are mainly capacitively coupled to the electrodes 26c and 26d, and the electrodes 26a and 26b are respectively connected to the electrodes 26c and 26d through the via hole conductors 27 and are electrically connected to the feeder electrodes 19a and 19b through the conductive adhesive 22. Thus, the operations and advantages of the fifth preferred embodiment are similar to those of the first preferred embodiment.

Sixth Preferred Embodiment of Wireless IC Device, see FIG. 6

FIG. 6 shows a wireless IC device according to a sixth preferred embodiment of the present invention. The wireless IC device 1 basically has a similar configuration to that of the first preferred embodiment. The wireless IC device 1 is constructed so that the multilayer radiation substrate 20 includes the three-layer radiation plates 21a and 21b. The respective radiation plates 21a and 21b are mainly capacitively coupled to the feeder electrodes 19a and 19b, provided on the feeder circuit substrate 10, via the electrodes 26a and 26b, and the like, so the radiation characteristic is greatly improved. In addition, because the radiation plates having different lengths are provided, it is possible to widen the frequency band used in the wireless IC device. The other operations and advantages are similar to those of the first preferred embodiment.

Seventh Preferred Embodiment of Wireless IC Device, see FIG. 7

FIG. 7 shows a wireless IC device according to a seventh preferred embodiment of the present invention. The wireless IC device 1 basically has a similar configuration to that of the first preferred embodiment. The wireless IC device 1 is constructed so that the radiation plates 21a and 21b are provided in the multilayer radiation substrate 20 to have a coil shape through via hole conductors 28. Respective one ends of the coil-shaped radiation plates 21a and 21b are mainly capacitively coupled to the feeder electrodes 19a and 19b, provided on the feeder circuit substrate 20, through the electrodes 26a and 26b, and the like. By forming the radiation plates 21a and 21b in a coil shape, the radiation characteristic is greatly improved. The other operations and advantages are similar to those of the first preferred embodiment.

Eighth Preferred Embodiment of Wireless IC Device, see FIG. 8

FIG. 8 shows a wireless IC device according to an eighth preferred embodiment of the present invention. The wireless IC device 1 basically has a similar configuration to that of the first preferred embodiment. The wireless IC device 1 is constructed so that a resonant circuit includes an element incorporated in the feeder circuit substrate 10 and an element 71 mounted on the feeder circuit substrate 10. The element 71 is a chip inductor, a chip capacitor, or other suitable electronic component. The chip-type element may have a large inductance or a large capacitance, and the element incorporated in the feeder circuit substrate 10 may have a small inductance or a small capacitance. Thus, it is possible to further miniaturize the feeder circuit substrate 10. The other operations and advantages are similar to those of the first preferred embodiment.

Figure 9:
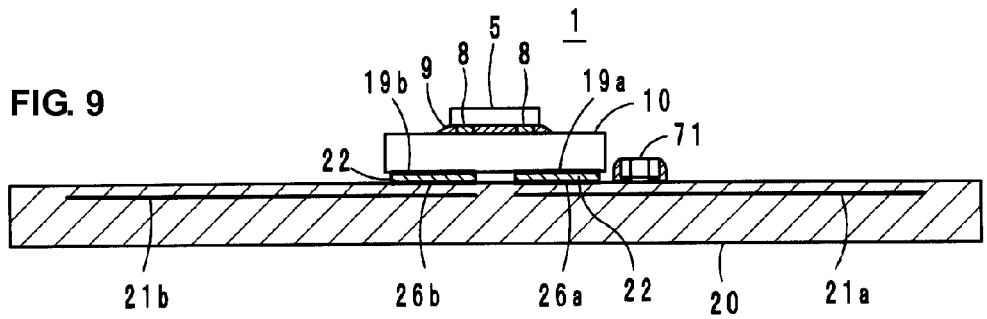
FIG. 9 is a cross-sectional view of a wireless IC device according to a ninth preferred embodiment of the present invention.

Ninth Preferred Embodiment of Wireless IC Device, see FIG. 9

FIG. 9 shows a wireless IC device according to a ninth preferred embodiment of the present invention. The wireless IC device 1 basically has a similar configuration to that of the first preferred embodiment. The wireless IC device 1 is constructed so that a resonant circuit includes an element incorporated in the feeder circuit substrate 10 and the element 71 mounted on the radiation substrate 20. The element 71 may be a chip inductor, a chip capacitor, or other suitable electronic component, as described in the eight preferred embodiment, and the operations and advantages are similar to those of the eighth preferred embodiment.

Figure 10:
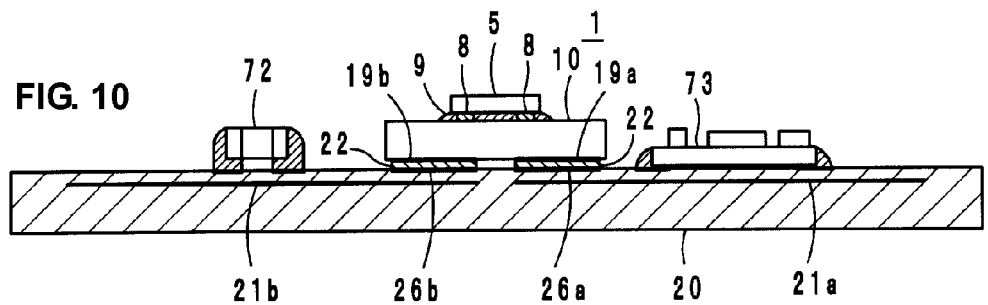
FIG. 10 is a cross-sectional view of a wireless IC device according to a tenth preferred embodiment of the present invention.

Tenth Preferred Embodiment of Wireless IC Device, see FIG. 10

FIG. 10 shows a wireless IC device according to a tenth preferred embodiment of the present invention. The wireless IC device 1 is constructed so that various electronic circuit components other than the wireless IC device 1 are mounted on a printed wiring board 20 which serves as a radiation substrate. In other words, the wireless IC device 1 is mounted on the printed wiring board 20 incorporated in a wireless communication device, such as a cellular phone, and the wireless IC device 1 has a similar configuration to that of the first preferred embodiment. In addition, the radiation plates 21a and 21b may have the function of a ground electrode or a shield electrode.

In the tenth preferred embodiment, the mounted electronic circuit components, for example, include a chip resistor 72 and a wireless communication circuit 73 on which IC components are mounted. Note that in the first to tenth preferred embodiments, the radiation plates 21a and 21b may be disposed on the back surface of the radiation substrate 20.

Figure 11:
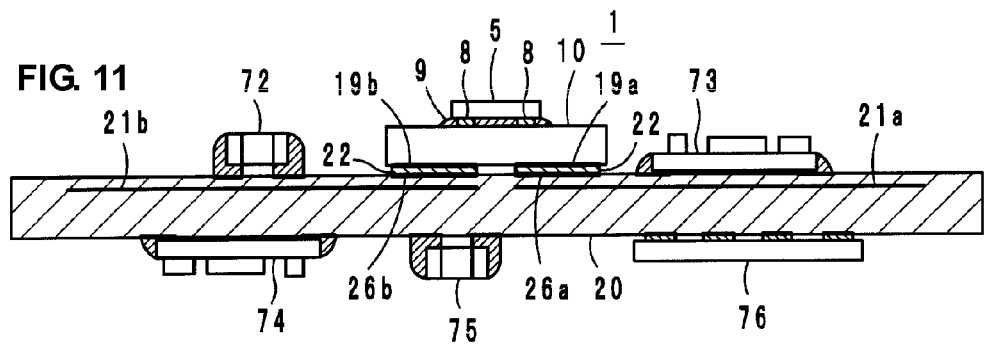
FIG. 11 is a cross-sectional view of a wireless IC device according to an eleventh preferred embodiment of the present invention.

Eleventh Preferred Embodiment of Wireless IC Device, see FIG. 11

FIG. 11 shows a wireless IC device according to an eleventh preferred embodiment of the present invention. The wireless IC device 1, as well as the tenth preferred embodiment, is mounted on the printed wiring board 20 incorporated in a wireless communication device. In addition to the chip resistor 72 and the wireless communication circuit 73, a wireless communication circuit 74, a chip capacitor 75 and a circuit substrate 76 are mounted on a surface opposite to a principal surface on which the feeder circuit substrate 10 is mounted. At this time, the radiation plates 21a and 21b may have the function of a ground electrode or a shield electrode.

Figure 12:
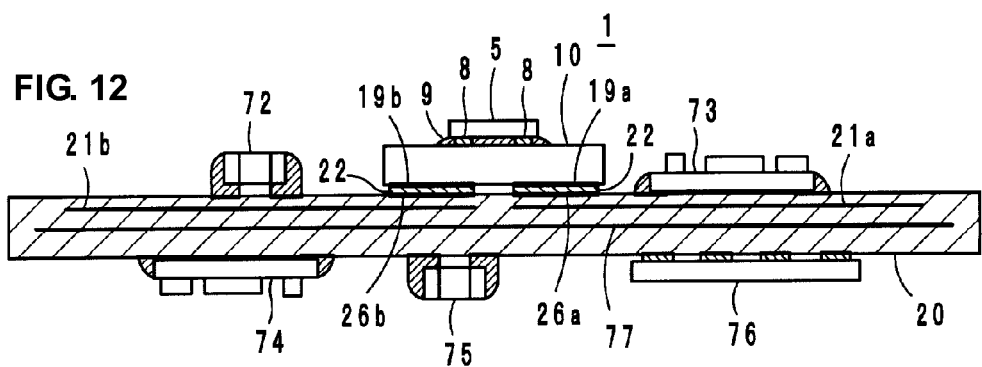
FIG. 12 is a cross-sectional view of a wireless IC device according to a twelfth preferred embodiment of the present invention.

Twelfth Preferred Embodiment of Wireless IC Device, see FIG. 12

FIG. 12 shows a wireless IC device according to a twelfth preferred embodiment of the present invention. The wireless IC device 1, as well as the eleventh preferred embodiment, is mounted on the printed wiring board 20 incorporated in a wireless communication device. A shield electrode 77 is incorporated in the printed wiring board 20 in order to provide magnetic shield between components on the surface and components on the back surface.

Figure 13:
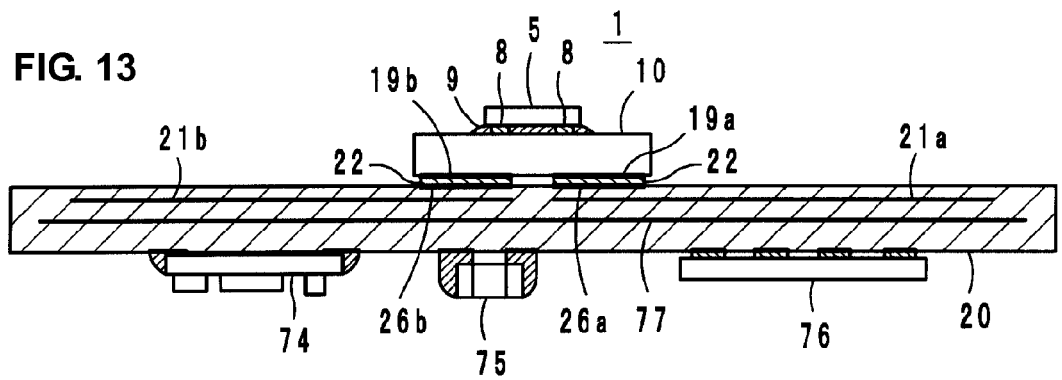
FIG. 13 is a cross-sectional view of a wireless IC device according to a thirteenth preferred embodiment of the present invention.

Thirteenth Preferred Embodiment of Wireless IC Device, see FIG. 13

FIG. 13 shows a wireless IC device according to a thirteenth preferred embodiment of the present invention. The wireless IC device 1, as well as the tenth preferred embodiment, is mounted on the printed wiring board 20 incorporated in a wireless communication device. The shield electrode 77 is incorporated in the substrate 20 in order to provide magnetic shield between the feeder circuit substrate 10 and the wireless IC chip 5, which are provided on the surface, and the wireless communication circuit 74, the chip resistor 75 and the circuit substrate 76, which are provided on the back surface.

Figure 14:
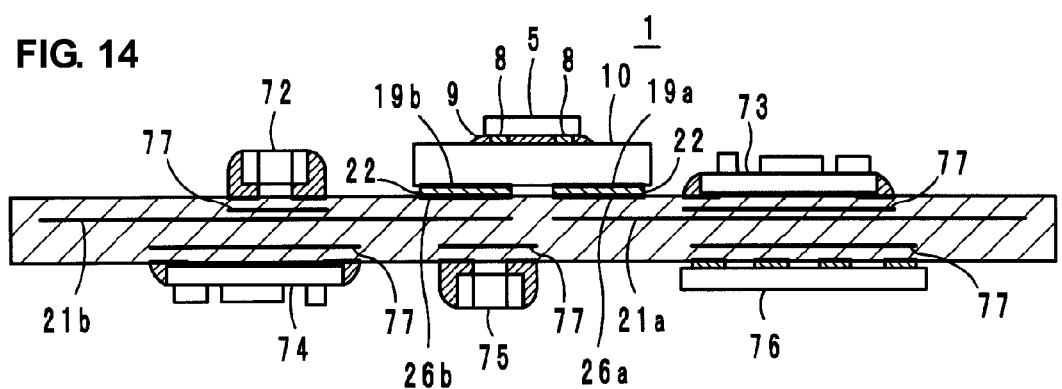
FIG. 14 is a cross-sectional view of a wireless IC device according to a fourteenth preferred embodiment of the present invention.

Fourteenth Preferred Embodiment of Wireless IC Device, see FIG. 14

FIG. 14 shows a wireless IC device according to a fourteenth preferred embodiment of the present invention. The wireless IC device 1, as well as the tenth to thirteenth preferred embodiments, is mounted on the printed wiring board 20 incorporated in a wireless communication device. The radiation plates 21a and 21b each are laminated between the shield electrodes 77. The radiation plates 21a and 21b are mainly capacitively coupled to the feeder electrodes 19a and 19b, provided on the feeder circuit substrate 10, through the electrodes 26a and 26b, and the like.

Figure 15:
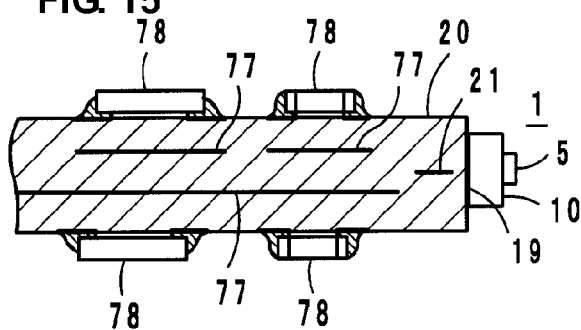
FIG. 15 is a cross-sectional view of a wireless IC device according to a fifteenth preferred embodiment of the present invention.

Fifteenth Preferred Embodiment of Wireless IC Device, see FIG. 15

FIG. 15 shows a wireless IC device according to a fifteenth preferred embodiment of the present invention. The wireless IC device 1 is mounted on the printed wiring board 20 incorporated in a wireless communication device. The feeder circuit substrate 10 equipped with the wireless IC chip 5 is mounted on a side surface of the printed wiring board 20. The feeder electrode 19 is electromagnetically coupled to the radiation plate 21 provided in the substrate 20 in an electrically non-conductive state. In addition, electronic components 78, such as chip resistors, are mounted on both front and back surfaces of the printed wiring board 20, and the plurality of shield electrodes 77 are provided inside the printed wiring board 20.

Figure 16:
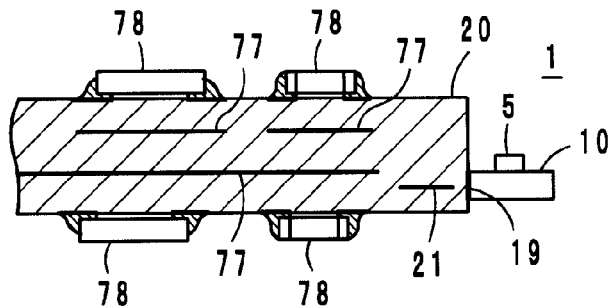
FIG. 16 is a cross-sectional view of a wireless IC device according to a sixteenth preferred embodiment of the present invention.

Sixteenth Preferred Embodiment of Wireless IC Device, see FIG. 16

FIG. 16 shows a wireless IC device according to a sixteenth preferred embodiment of the present invention. The wireless IC device 1 is mounted on the printed wiring board 20 incorporated in a wireless communication device. The feeder circuit substrate 10 equipped with the wireless IC chip 5 is mounted on a side surface of the printed wiring board 20. The feeder electrode 19 is provided on a side surface of the feeder circuit substrate 10, and the feeder electrode 19 is electromagnetically coupled to the radiation plate 21 provided inside the substrate 20 in an electrically non-conductive state. In addition, the electronic components 78, such as chip resistors, are mounted on both front and back surfaces of the printed wiring board 20, and the plurality of shield electrodes 77 are provided inside the printed wiring board 20.

Figure 17:
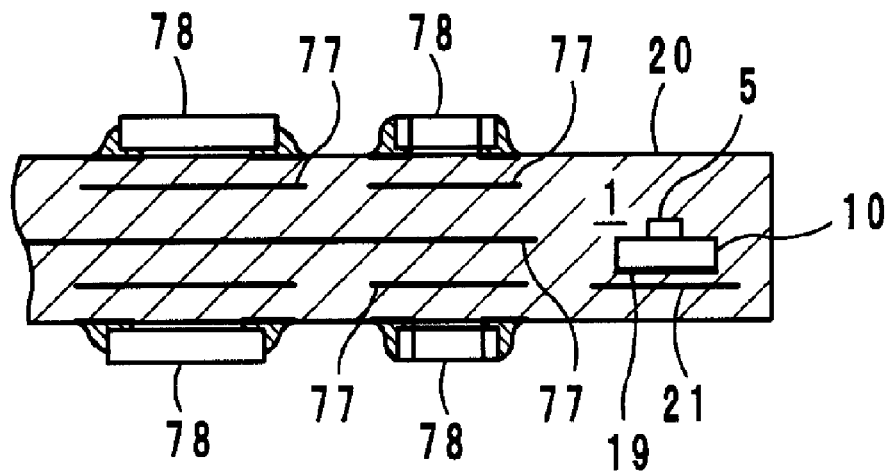
FIG. 17 is a cross-sectional view of a wireless IC device according to a seventeenth preferred embodiment of the present invention.

Seventeenth Preferred Embodiment of Wireless IC Device, see FIG. 17

FIG. 17 shows a wireless IC device according to a seventeenth preferred embodiment of the present invention. The wireless IC device 1 is accommodated inside the printed wiring board 20 incorporated in a wireless communication device, and the feeder electrode 19 is electromagnetically coupled to the radiation plate 21 provided inside the substrate 20 in an electrically non-conductive state. In addition, the electronic components 78, such as chip resistors, are mounted on both front and back surfaces of the printed wiring board 20, and the plurality of shield electrodes 77 are provided inside the printed wiring board 20.

Figure 18:
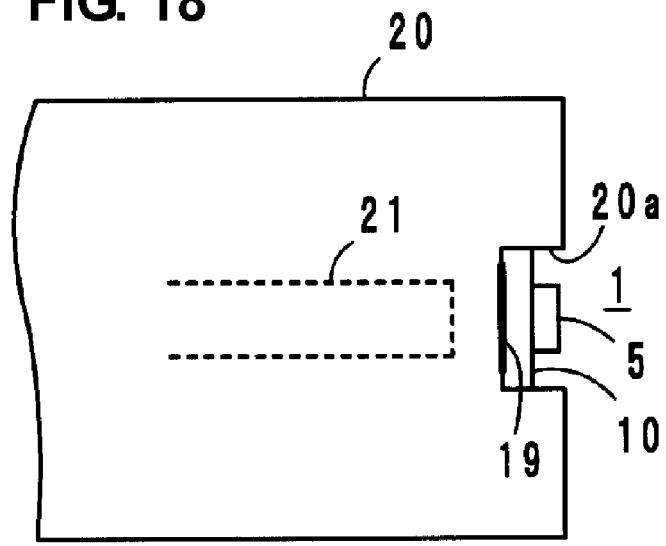
FIG. 18 is a plan view of a wireless IC device according to an eighteenth preferred embodiment of the present invention.

Eighteenth Preferred Embodiment of Wireless IC Device, see FIG. 18

FIG. 18 shows a wireless IC device according to an eighteenth preferred embodiment of the present invention. FIG. 18 is a plan view. The wireless IC device 1 is accommodated in a recess 20a formed on a side surface of the printed wiring board 20. The feeder electrode 19 provided on the back surface of the feeder circuit substrate 10 is electromagnetically coupled to the radiation plate 21 provided inside the substrate 20 in an electrically non-conductive state.

Figure 20:
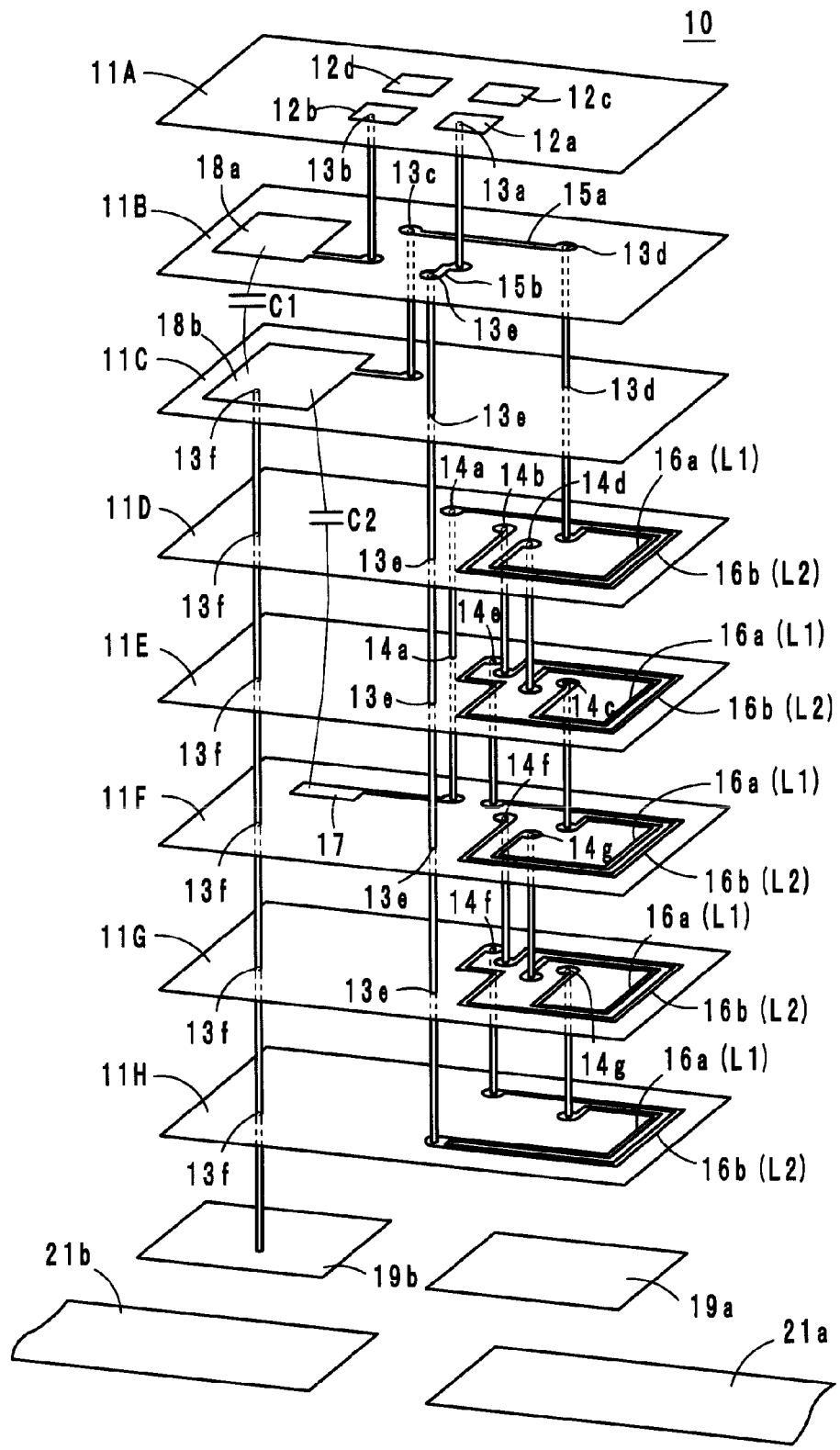
FIG. 20 is an exploded perspective view of a feeder circuit substrate that incorporates a first example of a resonant circuit.
Figure 21:
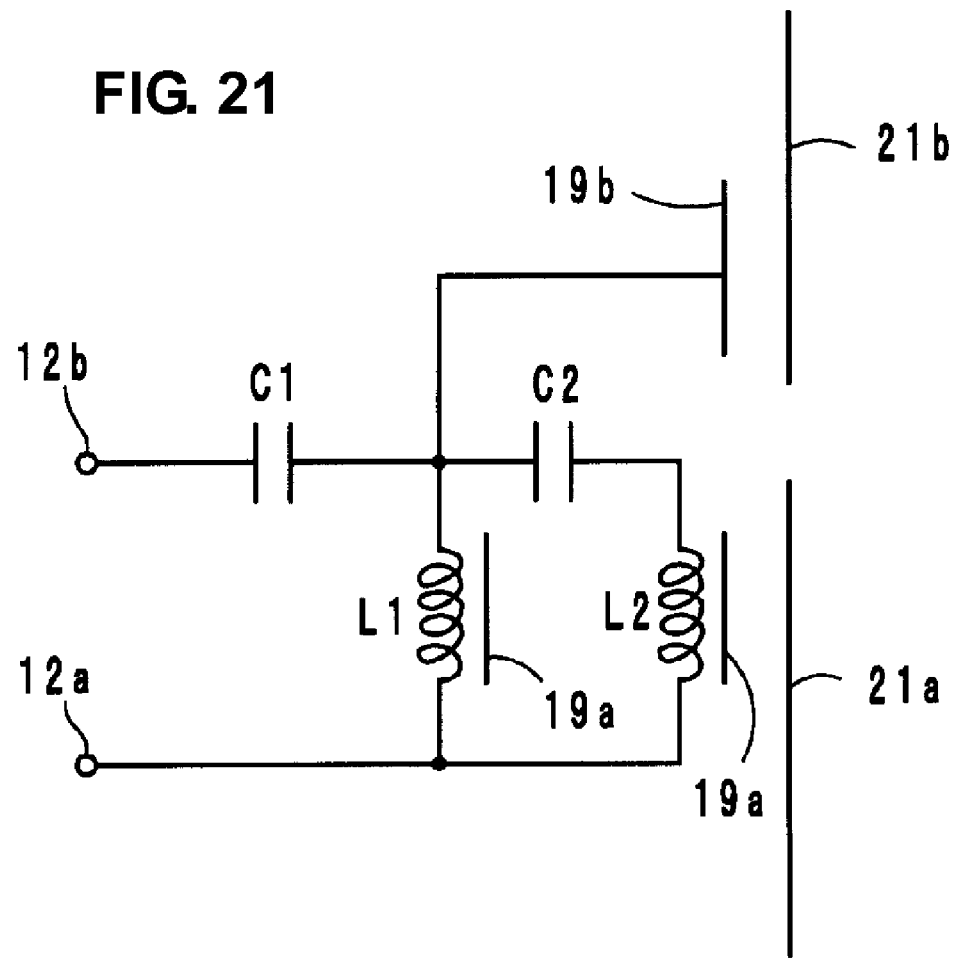
FIG. 21 is an equivalent circuit diagram that shows the first example of the resonant circuit.

First Example of Resonant Circuit, see FIG. 20 and FIG. 21

A first example of a resonant circuit incorporated in the feeder circuit substrate 10 is shown as an exploded perspective view of the feeder circuit substrate 10 in FIG. 20, and is also shown as an equivalent circuit in FIG. 21.

As shown in FIG. 20, the feeder circuit substrate 10 is constructed so that laminated ceramic sheets 11A to 11H made of dielectric material are pressure-bonded and fired. The connecting electrodes 12a and 12b, electrodes 12c and 12d and via hole conductors 13a and 13b are formed in the sheet 11A. A capacitor electrode 18a, conductor patterns 15a and 15b and via hole conductors 13c to 13e are formed in the sheet 11B. A capacitor electrode 18b and via hole conductors 13d to 13f are formed in the sheet 11C. Furthermore, conductor patterns 16a and 16b and via hole conductors 13e, 13f, 14a, 14b and 14d are formed in the sheet 11D. Conductor patterns 16a and 16b and via hole conductors 13e, 13f, 14a, 14c and 14e are formed in the sheet 11E. A capacitor electrode 17, conductor patterns 16a and 16b and via hole conductors 13e, 13f, 14f and 14g are formed in the sheet 11F. Conductor patterns 16a and 16b and via hole conductors 13e, 13f, 14f and 14g are formed in the sheet 11G. Conductor patterns 16a and 16b and a via hole conductor 13f are formed in the sheet 11H.

By laminating the sheets 11A to 11H, an inductance element L1 is defined by the conductor patterns 16a that are spirally connected through the via hole conductors 14c, 14d and 14g, an inductance element L2 is defined by the conductor patterns 16b that are spirally connected through the via hole conductors 14b, 14e and 14f, a capacitance element C1 is defined by the capacitor electrodes 18a and 18b, and a capacitance element C2 is defined by the capacitor electrodes 18b and 17.

One end of the inductance element L1 is connected to the capacitor electrode 18b through the via hole conductors 14c and 13d, the conductor pattern 15a and the via hole conductor 13c. One end of the inductance element L2 is connected to the capacitor electrode 17 through the via hole conductor 14a. In addition, the other ends of the inductance elements L1 and L2 are integrated in the sheet 11H, and connected to the connecting electrode 12a through the via hole conductor 13e, the conductor pattern 15b and the via hole conductor 13a. Furthermore, the capacitor electrode 18a is electrically connected to the connecting electrode 12b through the via hole conductor 13b.

Then, the connecting electrodes 12a and 12b are electrically connected to the terminal electrodes 6 (see FIG. 19) of the wireless IC chip 5 through the metal bumps 8 (see FIG. 1, or the like). The electrodes 12c and 12d are connected to the terminal electrodes 7 of the wireless IC chip 5.

In addition, the feeder electrodes 19a and 19b are provided on the back surface of the feeder circuit substrate 10, for example, by applying conductive paste. The feeder electrode 19a is electromagnetically coupled to the inductance elements L (L1 and L2). The feeder electrode 19b is electrically connected to the capacitor electrode 18b through the via hole conductor 13f. The feeder electrodes 19a and 19b are coupled to the radiation plates 21a and 21b in an electrically nonconductive state, as described above. The equivalent circuit of the above described resonant circuit is shown in FIG. 21.

Note that in the resonant circuit, the inductance elements L1 and L2 are structured so that the two conductor patterns 16a and 16b are arranged in parallel or substantially parallel with each other. The two conductor patterns 16a and 16b have different line lengths, so different resonant frequencies may be set for the two conductor patterns 16a and 16b. Thus, the wireless IC device 1 may have a wide band.

Note that the ceramic sheets 11A to 11H may be made of a magnetic ceramic material, and the feeder circuit substrate 10 may be easily obtained by a process of manufacturing a multilayer substrate, such as sheet lamination and thick film printing, used in the existing art.

In addition, it is also possible that the sheets 11A to 11H are formed as a flexible sheet made of a dielectric material, such as polyimide and liquid crystal polymer, electrodes and conductors are formed on the sheets by thick film forming, or the like, those sheets are laminated and thermally bonded to form a laminated body, and the inductance elements L1 and L2 and the capacitance elements C1 and C2 are incorporated in the laminated body.

In the feeder circuit substrate 10, the inductance elements L1 and L2 and the capacitance elements C1 and C2 are provided at different positions in plan view. The feeder circuit substrate 10 is electromagnetically coupled to the feeder electrode 19a (radiation plate 21a) by the inductance elements L1 and L2. The feeder circuit substrate 10 is capacitively coupled to the radiation plate 21b by the capacitance element C1.

Thus, the wireless IC device 1, in which the wireless IC chip 5 is mounted on the feeder circuit substrate 10, receives a high-frequency signal (for example, UHF frequency band) radiated from a reader/writer (not shown) by the radiation plates 21a and 21b, resonates the resonant circuit that is magnetically and electrically coupled to the feeder electrodes 19a and 19b, and supplies only a reception signal of a predetermined frequency band to the wireless IC chip 5. On the other hand, the wireless IC device 1 extracts predetermined energy from the reception signal, and matches information stored in the wireless IC chip 5 with a predetermined frequency in the resonant circuit using the predetermined energy as a driving source. After that, the wireless IC device 1 transmits the information to the radiation plates 21a and 21b through the feeder electrodes 19a and 19b, and then transmits and transfers the information from the radiation plates 21a and 21b to the reader/writer.

In the feeder circuit substrate 10, a resonant frequency characteristic is determined by the resonant circuit formed of the inductance elements L1 and L2 and the capacitance elements C1 and C2. The resonant frequency of a signal radiated from the radiation plates 21a and 21b is substantially determined by the self resonance frequency of the resonant circuit. Note that the circuit in the feeder circuit substrate is preferably designed so that the imaginary portion of an input/output impedance of the wireless IC chip 5 conjugates with the imaginary portion of an impedance when viewed from the connecting electrodes 12a and 12b on the feeder circuit substrate 10 toward the feeder electrodes 19a and 19b, thus making it possible to efficiently transmit and receive signals.

Incidentally, the resonant circuit also serves as a matching circuit for matching the impedance of the wireless IC chip 5 with the impedance of the radiation plates 21a and 21b. The feeder circuit substrate 10 may include a matching circuit that is provided separately from the resonant circuit including the inductance element and the capacitance element (in this sense, the resonant circuit is also referred to as a matching circuit). If the function of a matching circuit is added to the resonant circuit, the design of the resonant circuit tends to be complex. When a matching circuit is provided separately from the resonant circuit, it is possible to design the resonant circuit and the matching circuit separately.

In addition, the feeder circuit substrate 10 may include only a matching circuit. Furthermore, the circuit in the feeder circuit substrate 10 may include only an inductance element. In this case, the inductance element has the function of matching the impedance between the radiation plates 21a and 21b and the wireless IC chip 5.

In addition, as described in the eighth and ninth preferred embodiments, some of the elements that constitute the resonant circuit may be mounted on the substrate 10 or the substrate 20.

Figure 22:
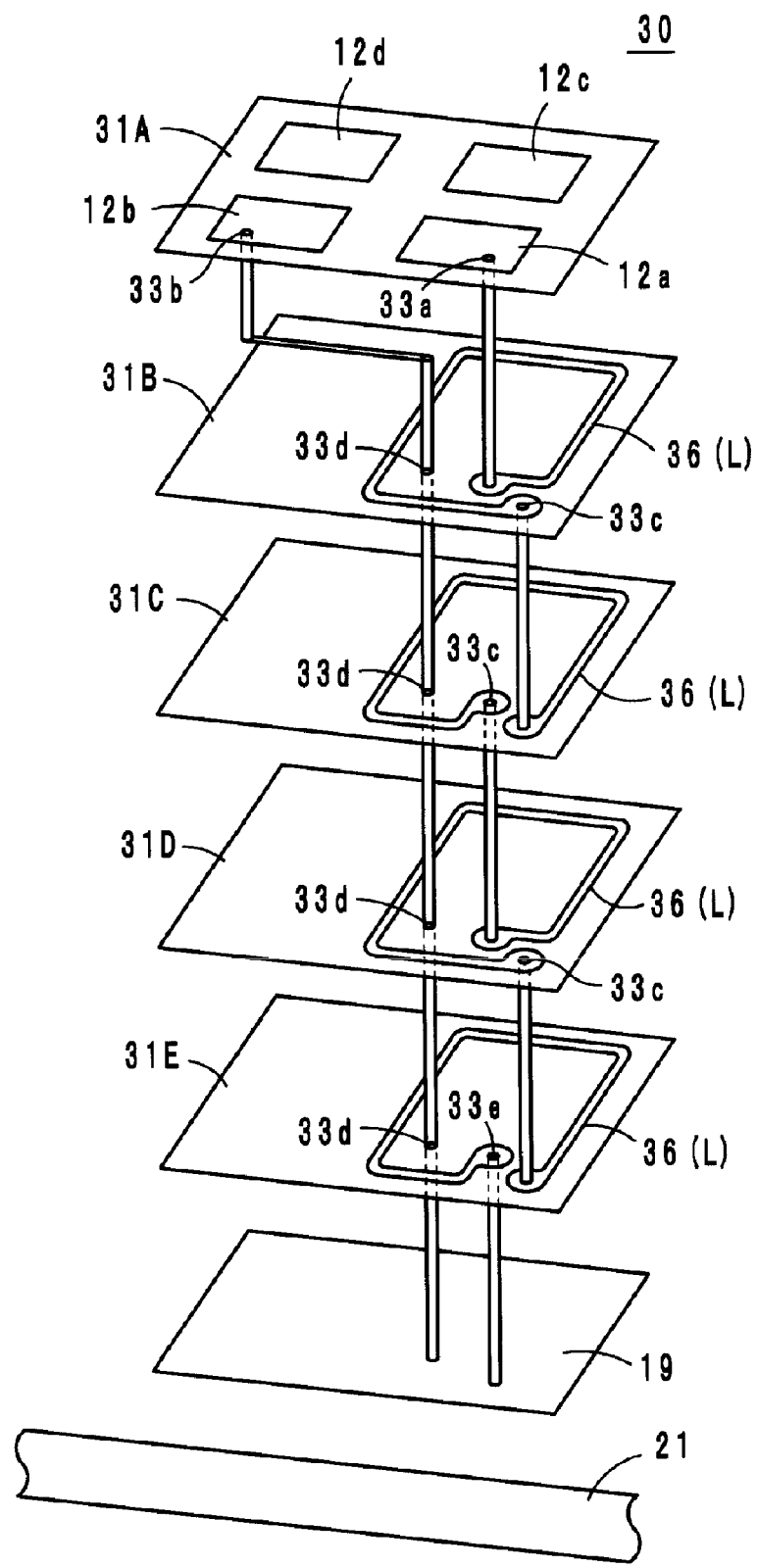
FIG. 22 is an exploded perspective view of a feeder circuit substrate that incorporates a second example of a resonant circuit.
Figure 23:
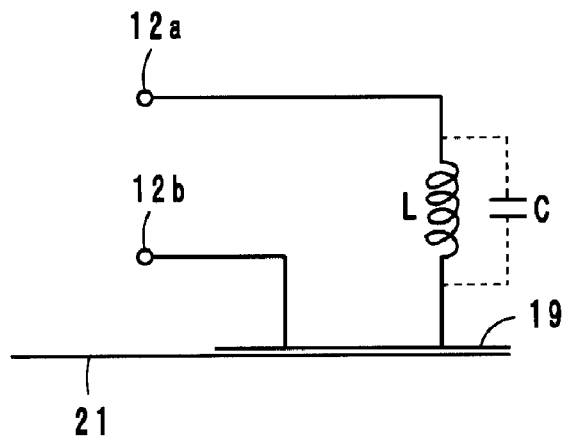
FIG. 23 is an equivalent circuit diagram that shows the second example of the resonant circuit.

Second Example of Resonant Circuit, see FIG. 22 and FIG. 23

A second example of a resonant circuit incorporated in a feeder circuit substrate 30 is shown as an exploded perspective view of the feeder circuit substrate 30 in FIG. 22, and is also shown as an equivalent circuit in FIG. 23.

As shown in FIG. 22, the feeder circuit substrate 30 is constructed so that laminated ceramic sheets 31A to 31E made of a dielectric material are pressure-bonded and fired. The connecting electrodes 12a and 12b, electrodes 12c and 12d and via hole conductors 33a and 33b are disposed in the sheet 31A. Conductor patterns 36 and via hole conductors 33c and 33d are disposed in the sheets 31B, 31C and 31D. A conductor pattern 36 and a via hole conductor 33e are disposed in the sheet 33E.

By laminating the above sheets 31A to 31E, an inductance element L includes the conductor patterns 36 that are spirally connected by the via hole conductors 33c. In addition, a capacitance element C is defined by the line capacity of the conductor patterns 36. One end of the inductance element L is connected to the connecting electrode 12a through the via hole conductor 33a.

In addition, the feeder electrode 19 is provided on the back surface of the feeder circuit substrate 30 by, for example, applying conductive paste. The feeder electrode 19 is connected to the other end of the inductance element L through the via hole conductor 33e, and is connected to the connecting electrode 12b through the via hole conductors 33d and 33b. The feeder electrode 19 is coupled to the radiation plate 21 in an electrically non-conductive state. The equivalent circuit of the above described resonant circuit is shown in FIG. 23.

The resonant circuit is constructed so that the wireless IC chip 5 is galvanically connected to the feeder electrode 19, and supplies a high-frequency signal received by the radiation plate 21 to the wireless IC chip 5. On the other hand, information stored in the wireless IC chip 5 is transmitted to the feeder electrode 19 and the radiation plate through the resonant circuit to transmit and transfer the information from the radiation plate 21 to a reader/writer.

Preferred Embodiment of Electronic Apparatus, see FIG. 24 to FIG. 27

Figure 24:
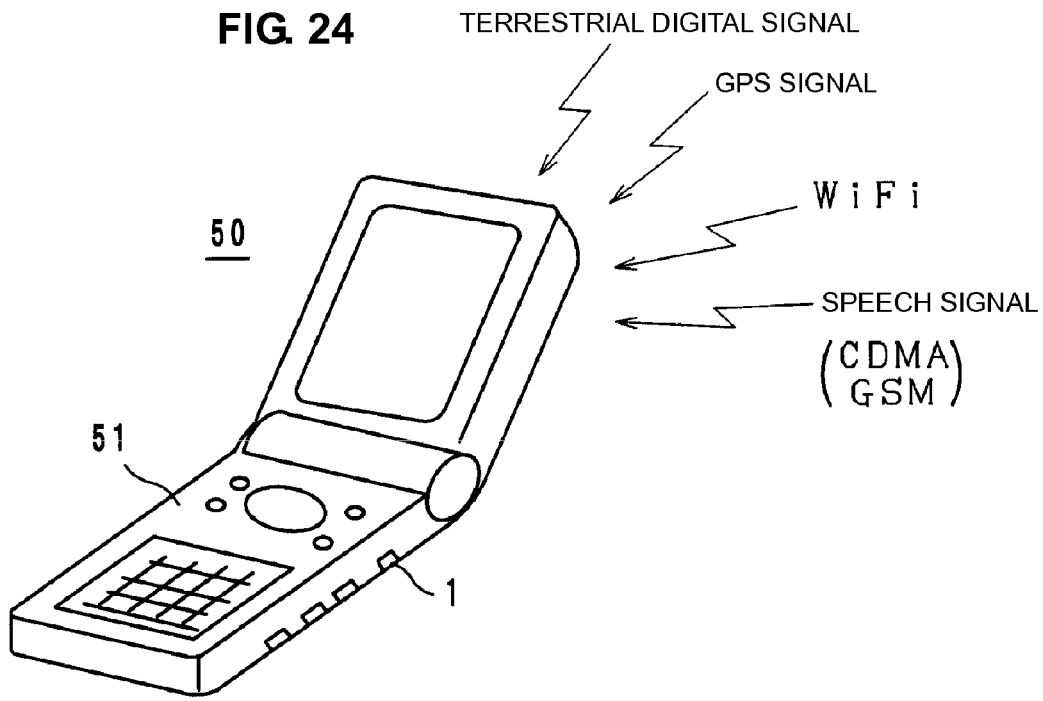
FIG. 24 is a perspective view of a cellular phone which is a preferred embodiment of an electronic apparatus according to the present invention.

Next, a cellular phone, which is one preferred embodiment of an electronic apparatus according to the present invention, will be described. A cellular phone 50 shown in FIG. 24 is able to handle a plurality of frequencies, and a terrestrial digital signal, a GPS signal, a WiFi signal, a communication signal, such as CDMA and GSM, are input to the cellular phone 50.

Figure 25:
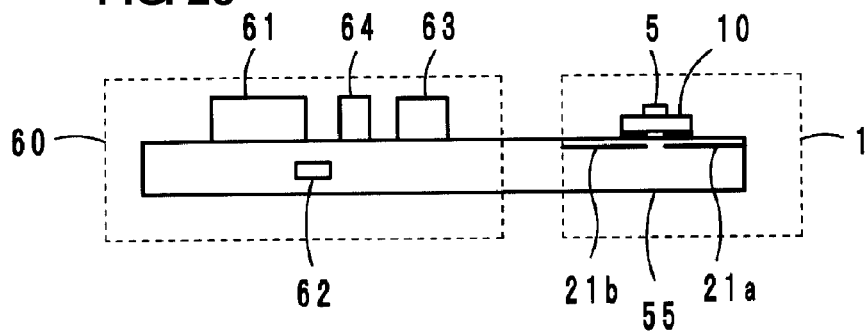
FIG. 25 is a view that illustrates a printed wiring board incorporated in the cellular phone.

As shown in FIG. 25, a printed wiring board 55 is installed in a casing 51. A wireless communication circuit 60 and the wireless IC device 1 are arranged on the printed wiring board 55. The wireless communication circuit 60 preferably includes an IC 61, a balun 62, incorporated in the board 55, a BPF 63 and a capacitor 64. The feeder circuit substrate 10, equipped with the wireless IC chip 5, is mounted so that the feeder electrodes 19a and 19b are coupled to the radiation plates 21a and 21b, provided for the printed wiring board 55, in an electrically non-conductive state, thus forming the wireless IC device 1.

Figure 26:
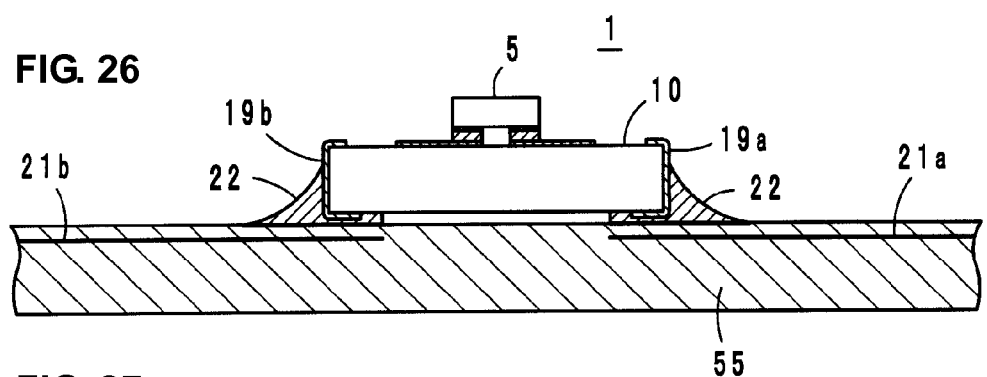
FIG. 26 is a cross-sectional view of a wireless IC device mounted on the printed wiring board.
Figure 27:
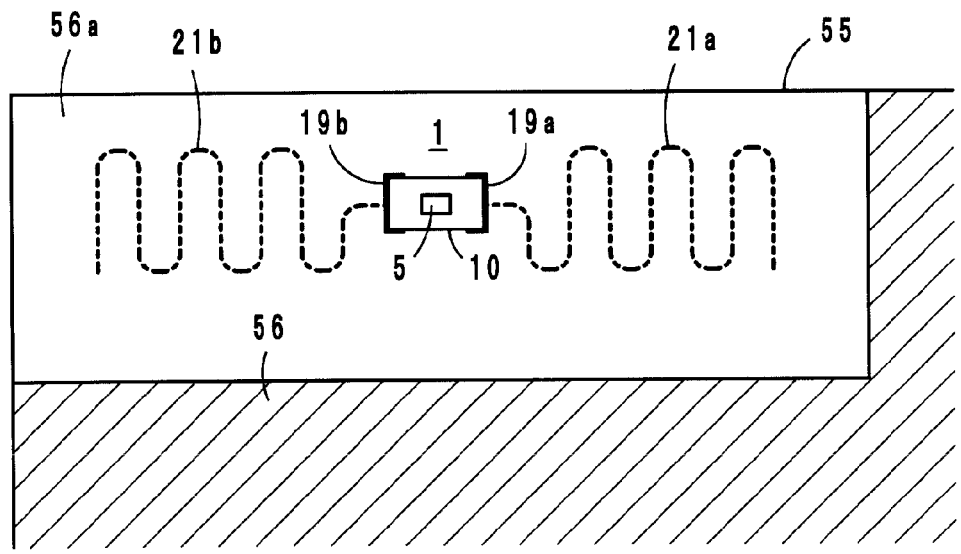
FIG. 27 is a plan view of the wireless IC device mounted on the printed wiring board.

The wireless IC device 1 mounted on the printed wiring board 55 may be the one shown in FIG. 26 and FIG. 27. The wireless IC device 1 is constructed so that the feeder electrodes 19a and 19b are provided on both side portions of the feeder circuit substrate 10 on which the wireless IC chip 5 is mounted, and the feeder electrodes 19a and 19b are coupled to the radiation plates 21a and 21b provided for the board 55 in an electrically non-conductive state. The resonant circuit in the feeder circuit substrate 10 is, for example, the one shown in FIG. 20.

A ground pattern 56 indicated by oblique lines in FIG. 27 is provided on the surface of the printed wiring board 55, and the wireless IC device 1 is mounted in an area 56a in which the ground pattern 56 is not located. In addition, the radiation plates 21a and 21b are preferably arranged in a meander shape. Note that the ground pattern 56 is preferably spaced apart from the radiation plates 21a and 21b to an extent such that the ground pattern 56 does not influence the radiation characteristic of the radiation plates 21a and 21b.

Figure 28A:
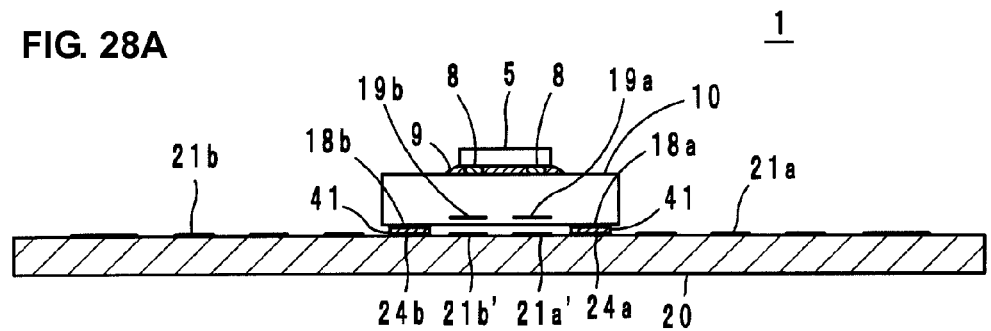
Figure 28B:
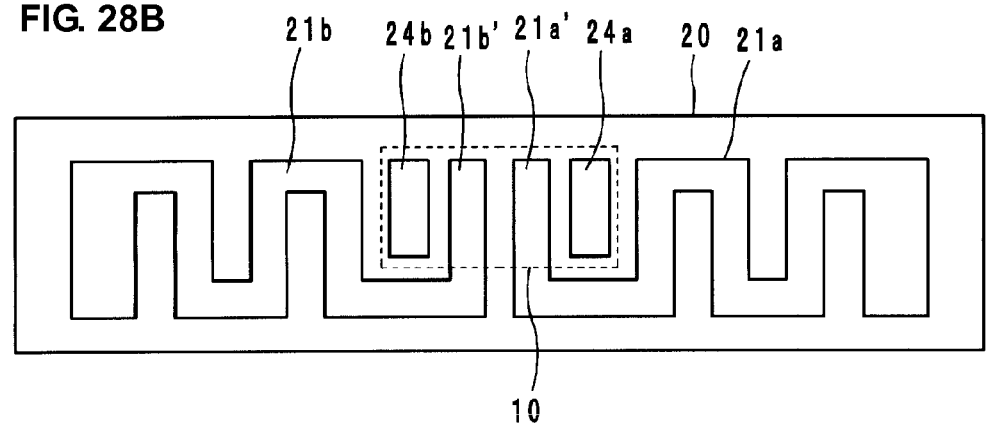

Nineteenth Preferred Embodiment of Wireless IC Device, see FIGS. 28A and 28B

FIGS. 28A and 28B shows a wireless IC device according to a nineteenth preferred embodiment of the present invention. The nineteenth preferred embodiment to a thirtieth preferred embodiment described below are constructed so that mounting electrodes 18a to 18d are provided for the feeder circuit substrate 10 in addition to the feeder electrodes 19, 19a and 19b described in the first preferred embodiment to the eighteenth preferred embodiment.

Specifically, in the nineteenth preferred embodiment, the feeder electrodes 19a and 19b are incorporated in the feeder circuit substrate 10, and are electromagnetically coupled to coupling portions 21a' and 21b', which are one end portions of the radiation plates 21a and 21b arranged to have a meander shape, in an electrically non-conductive state. The mounting electrodes 18a and 18b are disposed on the back surface of the feeder circuit substrate 10, and mounted electrodes 24a and 24b are disposed on the radiation substrate 20. The mounting electrodes 18a and 18b and the mounted electrodes 24a and 24b are respectively connected by a conductive material (which may be electrically insulating adhesive) such as solder 41.

The other configuration is similar to that of the first preferred embodiment. The basic operations and advantages as the wireless IC device are similar to those of the first preferred embodiment. In addition, in the nineteenth preferred embodiment, the mounting electrodes 18a and 18b are provided on the back surface of the feeder circuit substrate 10 and are connected to the mounted electrodes 24a and 24b provided on the radiation substrate 20. Thus, the bonding strength between the feeder circuit substrate 10 and the radiation substrate 20 improves. In addition, even when the wireless IC device receives an impact due to a drop, or the like, or even when the radiation substrate 20 or the feeder circuit substrate 10 thermally contracts to generate thermal stress, electromagnetic coupling between the feeder electrodes 19a and 19b and the radiation plates 21a and 21b is not adversely influenced.

Figure 29:
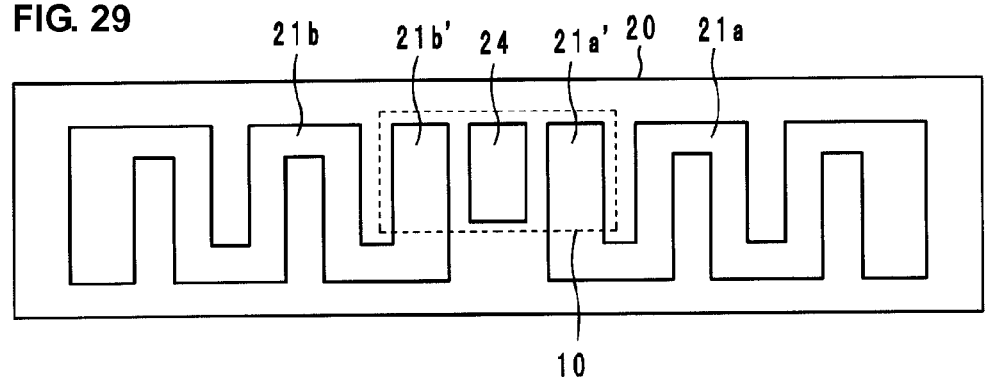
FIG. 29 is a plan view of a radiation plate of a wireless IC device according to a twentieth preferred embodiment of the present invention.

Twentieth Preferred Embodiment of Wireless IC Device, see FIG. 29

FIG. 29 shows a wireless IC device according to a twentieth preferred embodiment of the present invention. The twentieth preferred embodiment basically has a similar configuration to those of the first to nineteenth preferred embodiments, and differs from the first to nineteenth preferred embodiments in that a single mounted electrode 24 is provided on the radiation substrate 20 so that the mounted electrode 24 is placed between the coupling portions 21a' and 21b', which are one ends of the radiation plates 21a and 21b. A single mounting electrode (not shown) is provided on the back surface of the feeder circuit substrate 10 at a position facing the mounted electrode 24, and is connected to the mounted electrode 24 through solder or adhesive.

The other configuration is similar to that of the first preferred embodiment. The basic operations and advantages as the wireless IC device are similar to those of the first preferred embodiment. The operations and advantages when provided with the mounting electrode are similar to those of the nineteenth preferred embodiment. In addition, the mounting electrode is preferably located in the middle portion, so it is possible to extend the radiation plates 21a and 21b from a side in the longitudinal direction of the feeder circuit substrate 10. In addition, stress applied to a protruding portion reduces against warpage, or the like, of the feeder circuit substrate 10.

Figure 30:
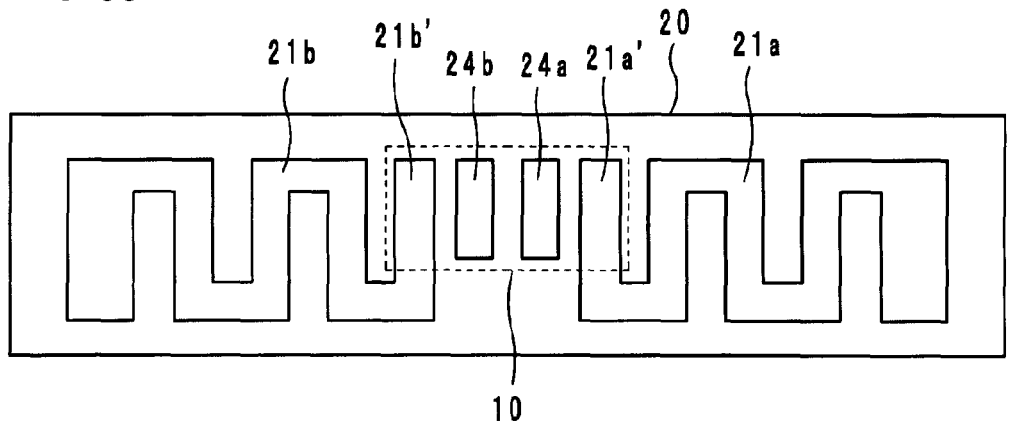
FIG. 30 is a plan view of a radiation plate of a wireless IC device according to a twenty-first preferred embodiment of the present invention.

Twenty-First Preferred Embodiment of Wireless Ic Device, See FIG. 30

FIG. 30 shows a wireless IC device according to a twenty-first preferred embodiment of the present invention. The twenty-first preferred embodiment basically has a similar configuration to those of the first to twentieth preferred embodiments, and differs from the first to twentieth preferred embodiments in that two mounted electrodes 24a and 24b are provided on the radiation substrate 20 so that the mounted electrodes 24a and 24b are placed between the coupling portions 21a' and 21b', which are one ends of the radiation plates 21a and 21b. The mounted electrodes 24a and 24b are arranged in the long side direction. Instead, the mounted electrodes 24a and 24b may be arranged in the short side direction or may be arranged in a diagonal line direction. The mounting electrodes (not shown) are provided on the back surface of the feeder circuit substrate 10 at positions facing the mounted electrodes 24a and 24b, and are connected to the mounted electrodes 24a and 24b through solder or adhesive, for example.

The other configuration is similar to that of the first preferred embodiment. The basic operations and advantages as the wireless IC device are similar to those of the first preferred embodiment. The operations and advantages when provided with the mounting electrodes are those described in the nineteenth preferred embodiment.

Figure 31:
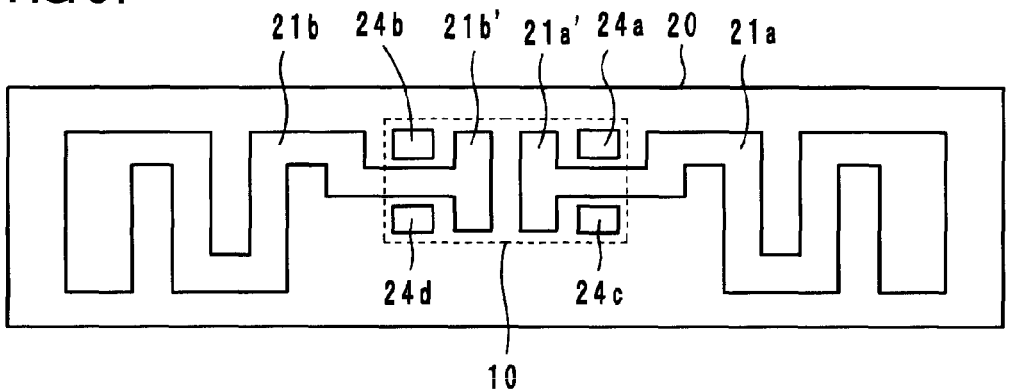
FIG. 31 is a plan view of a radiation plate of a wireless IC device according to a twenty-second preferred embodiment of the present invention.

Twenty-Second Preferred Embodiment of Wireless IC Device, see FIG. 31

FIG. 31 shows a wireless IC device according to a twenty-second preferred embodiment of the present invention. The twenty-second preferred embodiment basically has a similar configuration to those of the first to nineteenth preferred embodiments, and differs from the first to nineteenth preferred embodiments in that four mounted electrode 24a to 24d are provided on the radiation substrate 20 at outer edges of the feeder circuit substrate 10. The coupling portions 21a' and 21b', which are one ends of the radiation plates 21a and 21b, are arranged at the center portion through a gap between the mounted electrodes 24a and 24b and a gap between the mounted electrodes 24c and 24d. The mounting electrodes (not shown) are provided on the back surface of the feeder circuit substrate 10 at positions facing the mounted electrodes 24a to 24d, and are connected to the mounted electrodes 24a to 24d through solder or adhesive, for example.

The other configuration is similar to that of the first preferred embodiment. The basic operations and advantages as the wireless IC device are similar to those of the first preferred embodiment. The operations and advantages when provided with the mounting electrodes are those described in the nineteenth preferred embodiment. Particularly, in the twenty-second preferred embodiment, the mounting electrodes and the mounted electrodes 24a to 24d are provided at the outer edge portions of the feeder circuit substrate 10. This improves the accuracy of a position when the feeder circuit substrate 10 is mounted on the radiation substrate 20 using reflow solder. That is, this is because, during reflow soldering, self-alignment effect due to the surface tension of solder arises at each of the four electrodes 24a to 24d located at the outer edge portions.

Figure 32A:
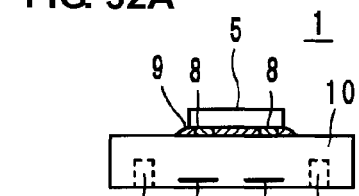
Figure 32B:
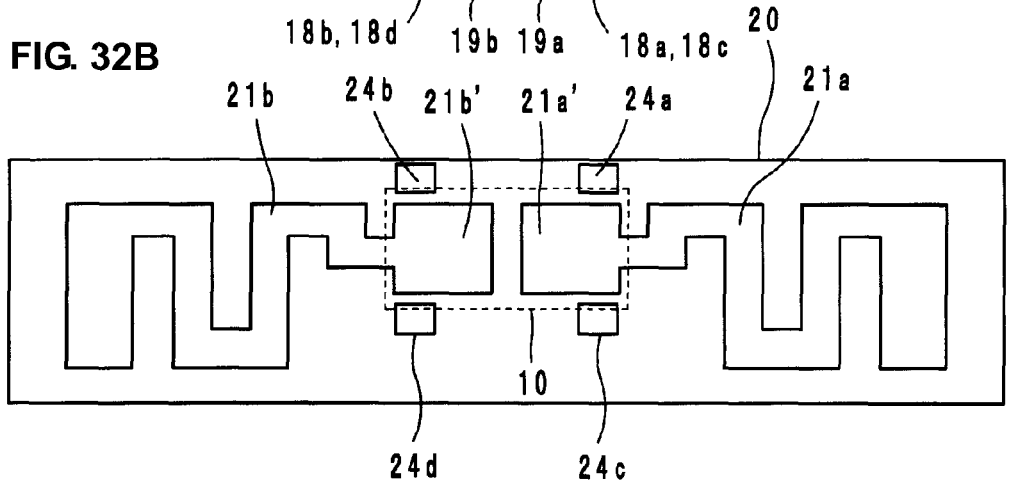

Twenty-Third Preferred Embodiment of Wireless IC Device, see FIGS. 32A and 32B

FIGS. 32A and 32B show a wireless IC device according to a twenty-third preferred embodiment of the present invention. The twenty-third preferred embodiment basically has a similar configuration to those of the first to nineteenth preferred embodiments, and differs from the first to nineteenth preferred embodiments in that the mounting electrodes 18a to 18d are formed on both side surfaces (on the near side and far side with respect to the sheet of FIGS. 32A and 32B) of the feeder circuit substrate 10. The mounted electrodes 24a to 24d are formed on the radiation substrate 20 at positions corresponding to the mounting electrodes 18a to 18d so that the mounted electrodes 24a to 24d protrude outward from the outline of the feeder circuit substrate 10, and are connected to the mounting electrodes 18a to 18d through solder or adhesive.

The other configuration is similar to that of the first preferred embodiment. The basic operations and advantages as the wireless IC device are similar to those of the first preferred embodiment. The operations and advantages when provided with the mounting electrodes 18a to 18d are those described in the nineteenth preferred embodiment. Particularly, in the twenty-third preferred embodiment, the mounting electrodes 18a to 18d are provided on the side surfaces of the feeder circuit substrate 10, so there is a spatial room on the back surface of the substrate 10. Thus, by arranging the coupling portions 21a' and 21b', which are one end portions of the radiation plates 21a and 21b, substantially over the entire back surface, it is possible to improve a degree of coupling to which the feeder electrodes 19a and 19b are coupled to the radiation plates 21a and 21b.

Figure 33:
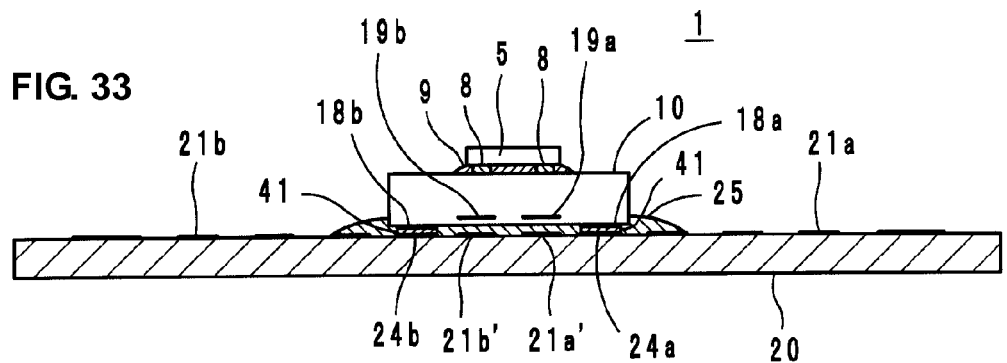
FIG. 33 is a cross-sectional view of a wireless IC device according to a twenty-fourth preferred embodiment of the present invention.

Twenty-Fourth Preferred Embodiment of Wireless IC Device, see FIG. 33

FIG. 33 shows a wireless IC device according to a twenty-fourth preferred embodiment of the present invention. The twenty-fourth preferred embodiment basically has a similar configuration to those of the first to nineteenth preferred embodiments, and differs from the first to nineteenth preferred embodiments in that a sealing resin 25 is applied in between the radiation substrate 20 and the feeder circuit substrate 10. The sealing resin 25 is, for example, epoxy-based adhesive and improves fixing strength and environmental resistance, and the adhesive has a dielectric constant higher than air. Thus, capacitances between the feeder electrodes 19a and 19b and the radiation plates 21a and 21b increase, and the degree of coupling increases. Note that application of the sealing resin 25 is performed after the mounted electrodes 24a and 24b and the mounting electrodes 18a and 18b are connected by solder 41 (reflow solder), for example.

The other configuration is similar to that of the first preferred embodiment. The basic operations and advantages as the wireless IC device are similar to those of the first preferred embodiment. The operations and advantages when provided with the mounting electrodes 18a and 18b are those described in the nineteenth preferred embodiment.

Figure 34:
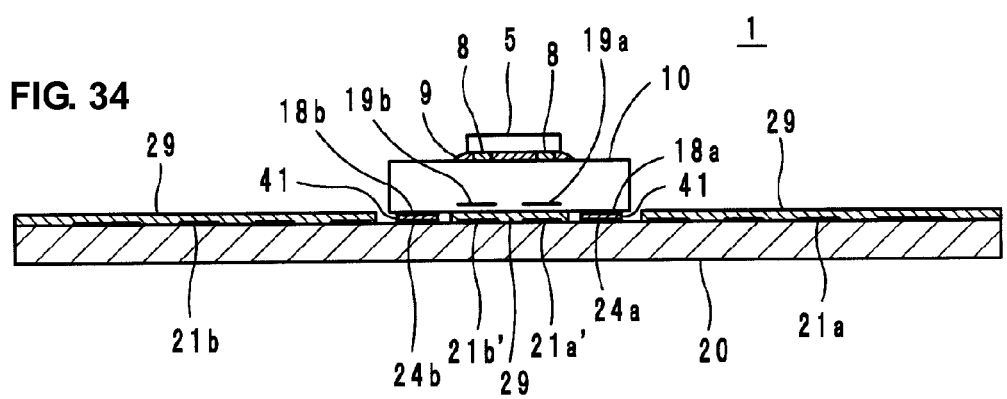
FIG. 34 is a cross-sectional view of a wireless IC device according to a twenty-fifth preferred embodiment of the present invention.

Twenty-Fifth Preferred Embodiment of Wireless IC Device, see FIG. 34

FIG. 34 shows a wireless IC device according to a twenty-fifth preferred embodiment of the present invention. The twenty-fifth preferred embodiment basically has a similar configuration to those of the first to nineteenth preferred embodiments, and differs from the first to nineteenth preferred embodiments in that a resist film 29 that covers the radiation plates 21a and 21b is provided on the radiation substrate 20. The resist film 29 is, for example, epoxy-based or polyimide-based resin material and improves environmental resistance of the radiation plates 21a and 21b, and the resin material has a dielectric constant higher than air. Thus, capacitances between the feeder electrodes 19a and 19b and the radiation plates 21a and 21b increase, and the degree of coupling increases. In addition, it is possible to determine a gap between the radiation plates 21a and 21b and the back surface of the feeder circuit substrate 20 based on the thickness of the resist film 29, it is possible to prevent variations in degree of coupling, and then the characteristic becomes stable.

The other configuration is similar to that of the first preferred embodiment. The basic operations and advantages as the wireless IC device are similar to those of the first preferred embodiment. The operations and advantages when provided with the mounting electrodes 18a and 18b are those described in the nineteenth preferred embodiment.

Figure 35:
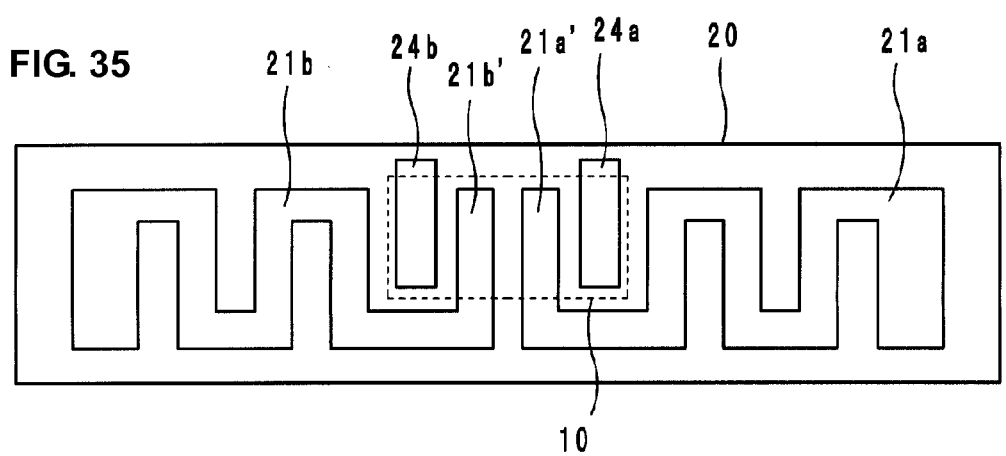
FIG. 35 is a plan view of a radiation plate of a wireless IC device according to a twenty-sixth preferred embodiment of the present invention.
Figure 36:
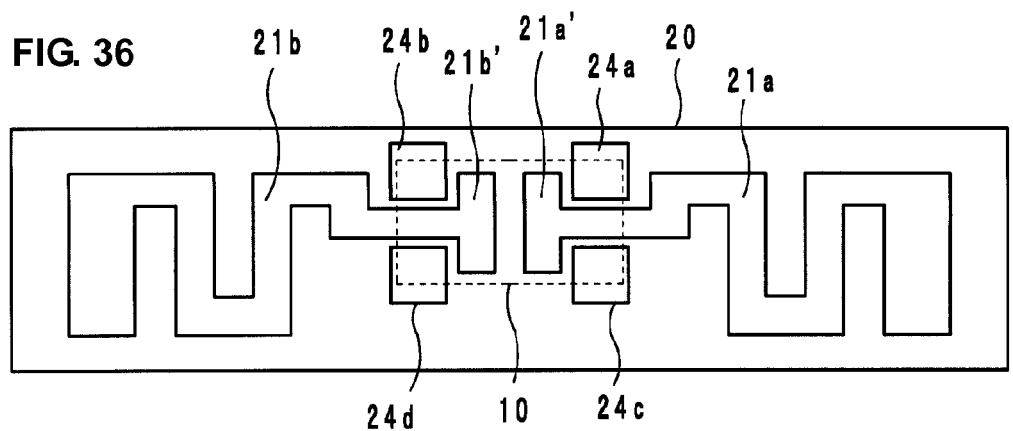
FIG. 36 is a plan view of a radiation plate of a wireless IC device according to a twenty-seventh preferred embodiment of the present invention.

Twenty-Sixth Preferred Embodiment and Twenty-seventh Preferred Embodiment of Wireless IC Device, see FIG. 35 and FIG. 36

FIG. 35 shows a wireless IC device according to a twenty-sixth preferred embodiment of the present invention. FIG. 36 shows a wireless IC device according to a twenty-seventh preferred embodiment of the present invention. The twenty-sixth preferred embodiment is formed so that the areas of the mounted electrodes 24a and 24b are increased from those in the nineteenth preferred embodiment. The twenty-seventh preferred embodiment is constructed so that the areas of the mounted electrodes 24a to 24d are increased from those in the twenty-second preferred embodiment.

The areas of the mounting electrodes 18a to 18d formed on the back surface of the feeder circuit substrate 10 are equal to those of the nineteenth and twenty-second preferred embodiments, and the amount of solder for bonding is supplied in accordance with the areas of the mounting electrodes 18a to 18d. Extra solder spreads over to the mounted electrodes 24a to 24d, so it is possible to reduce the thickness of solder, and it is possible to prevent variations in thickness of solder. By so doing, variations in gaps between the radiation plates 21a and 21b and the feeder electrodes 19a and 19b reduce, and the degree of coupling becomes stable. Then, it is desirable that Au plating, or the like, is applied to the mounted electrodes 24a to 24d to apply coating such that solder wets to spread over the mounting electrodes 24a to 24d.

In addition, as described in the twenty-fifth preferred embodiment, when the resist film 29 is formed on the radiation plates 21a and 21b, it is possible to determine a gap between the radiation plates 21a and 21b and the back surface of the feeder circuit substrate 10 based on the thickness of the resist film 29. A similar advantage to this may be achieved by forming a protrusion on the back surface of the feeder circuit substrate 10 using a conductive layer or a resin layer.

Figure 37A:
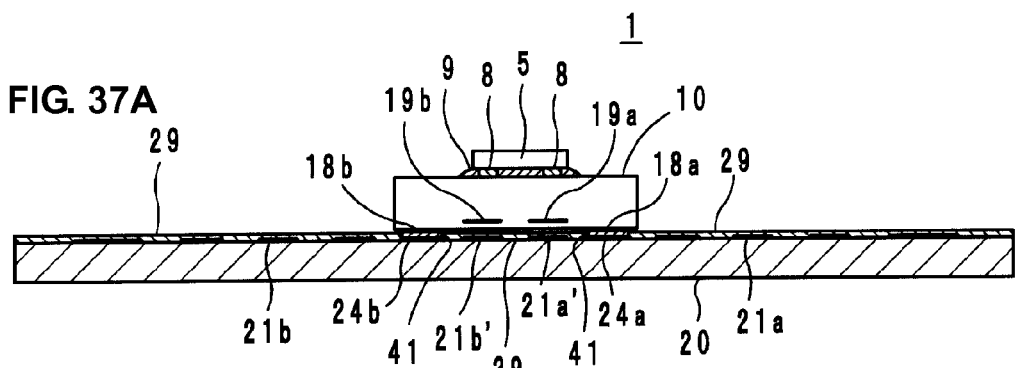
Figure 37B:
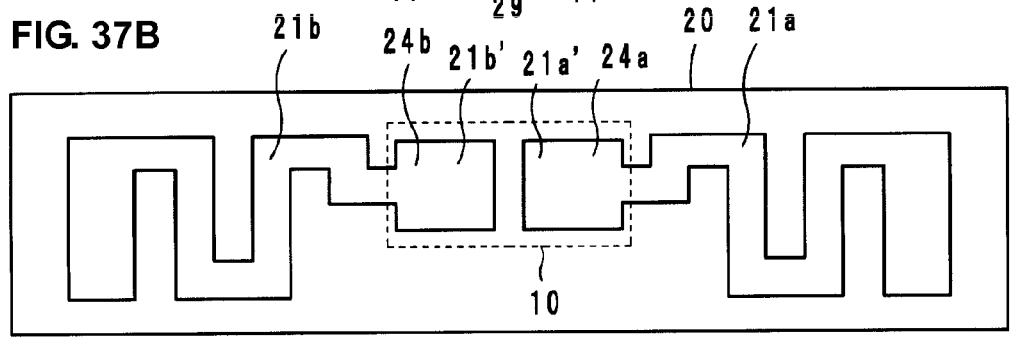

Twenty-Eighth Preferred Embodiment of Wireless IC Device, see FIGS. 37A and 37B

FIGS. 37A and 37B shows a wireless IC device according to a twenty-eighth preferred embodiment of the present invention. The twenty-eighth preferred embodiment basically has a similar configuration to those of the first to nineteenth preferred embodiments, and differs from the first to nineteenth preferred embodiments in that the coupling portions 21a' and 21b', which are one end portions of the radiation plates 21a and 21b, are integral with the mounted electrodes 24a and 24b. Furthermore, the resist film 29 is arranged on the radiation plates 21a and 21b other than the mounted electrodes 24a and 24b. The mounted electrodes 24a and 24b are bonded to the mounting electrodes 18a and 18b of the feeder circuit substrate 10 by solder 41, or the like.

The other configuration is similar to that of the first preferred embodiment. The basic operations and advantages as the wireless IC device are similar to those of the first preferred embodiment. The operations and advantages when provided with the mounting electrodes 18a and 18b are those described in the nineteenth preferred embodiment. Particularly, in the twenty-eighth preferred embodiment, because the radiation plates 21a and 21b include the mounted electrodes 24a and 24b, the electrodes are easily formed, and the strength of the mounted electrodes 24a and 24b increases.

Figure 38A:
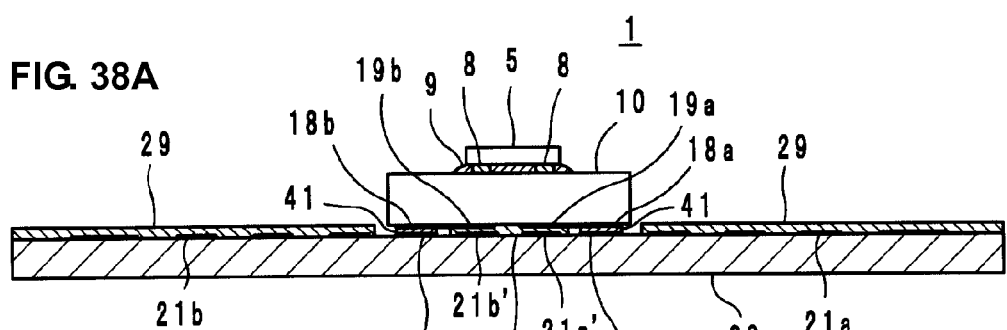
Figure 38B:
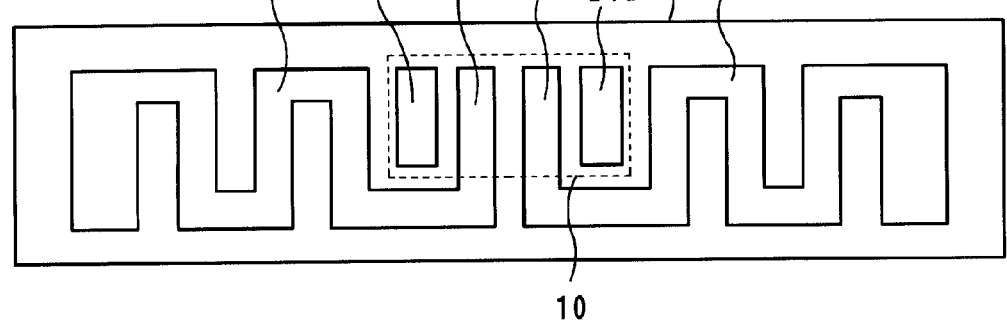

Twenty-Ninth Preferred Embodiment of Wireless IC Device, see FIGS. 38A and 38B

FIGS. 38A and 38B show a wireless IC device according to a twenty-ninth preferred embodiment of the present invention. The twenty-ninth preferred embodiment differs from the nineteenth preferred embodiment in that the feeder electrodes 19a and 19b and the mounting electrodes 18a and 18b are integrally formed. In this case, the feeder electrodes 19a and 19b are different from those of the nineteenth preferred embodiment and are exposed on the back surface of the feeder circuit substrate 10. By so doing, it is possible to reduce distances between the feeder electrodes 19a and 19b and the radiation plates 21a and 21b (coupling portions 21a' and 21b') to increase capacitances. In addition, the size of the mounting electrodes 18a and 18b is substantially increased, and it is possible to increase the strength of the mounting electrodes 18a and 18b.

Figure 39A:
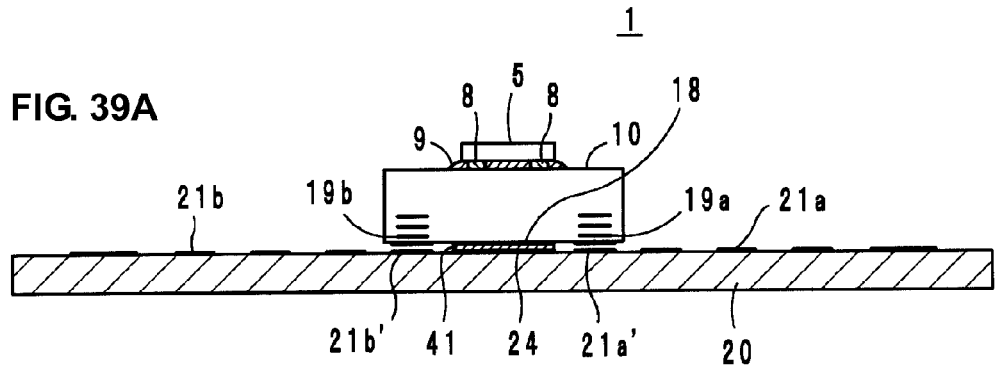
Figure 39B:
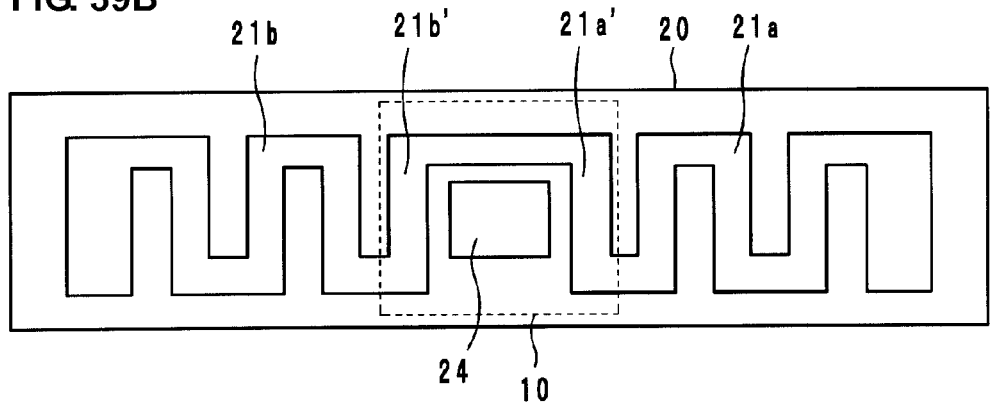

Thirtieth Preferred Embodiment of Wireless IC Device, see FIG. 39

FIG. 39 shows a wireless IC device according to a thirtieth preferred embodiment of the present invention. The thirtieth preferred embodiment is constructed so that the radiation plates 21a and 21b are integrated with the coupling portions 21a and 21b', which are one end portions, and the coupling portions 21a' and 21b' are magnetically coupled to the inductance elements L1 and L2 incorporated in the feeder circuit substrate 10. The feeder electrodes 19a and 19b preferably are part of the inductance elements L1 and L2. In addition, the mounted electrode 24 is located at the center portion of the radiation substrate 20, and is connected to the mounting electrode 18, provided on the back surface of the feeder circuit substrate 10, by solder 41, or the like.

The other configuration is similar to that of the first preferred embodiment. The basic operations and advantages as the wireless IC device are similar to those of the first preferred embodiment. The operations and advantages when provided with the mounting electrode 18 are those described in the nineteenth preferred embodiment. Particularly, in the thirtieth preferred embodiment, the radiation plates 21a and 21b are magnetically coupled to the feeder circuit substrate 10, so the characteristic remains unchanged even when a position at which the feeder circuit substrate 10 is mounted slightly deviates or is deviated by rotating 180 degrees. In addition, a change in characteristic is small even when a resin material having a high dielectric constant is interposed between the feeder circuit substrate 10 and the radiation plates 21a and 21b.

Figure 40:
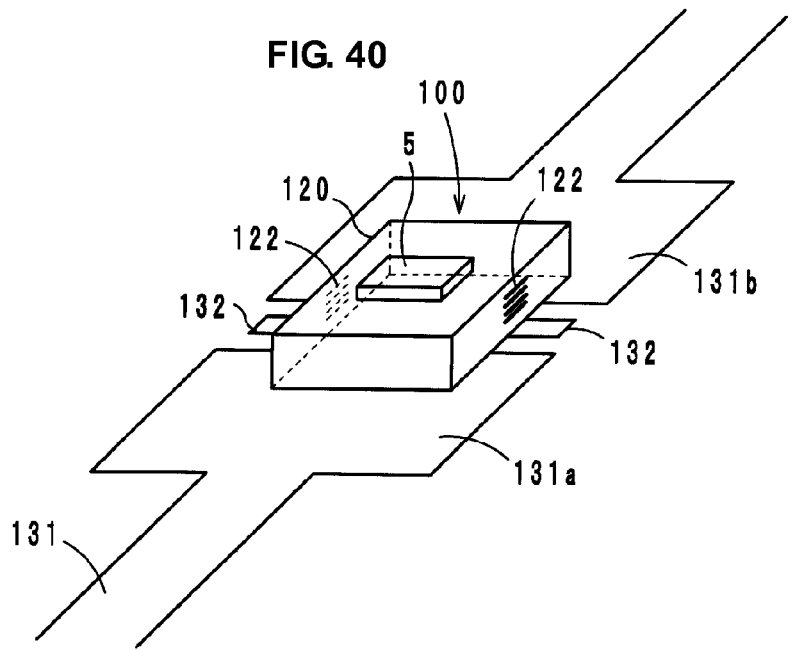
FIG. 40 is a perspective view of a wireless IC device according to a thirty-first preferred embodiment of the present invention.
Figure 41:
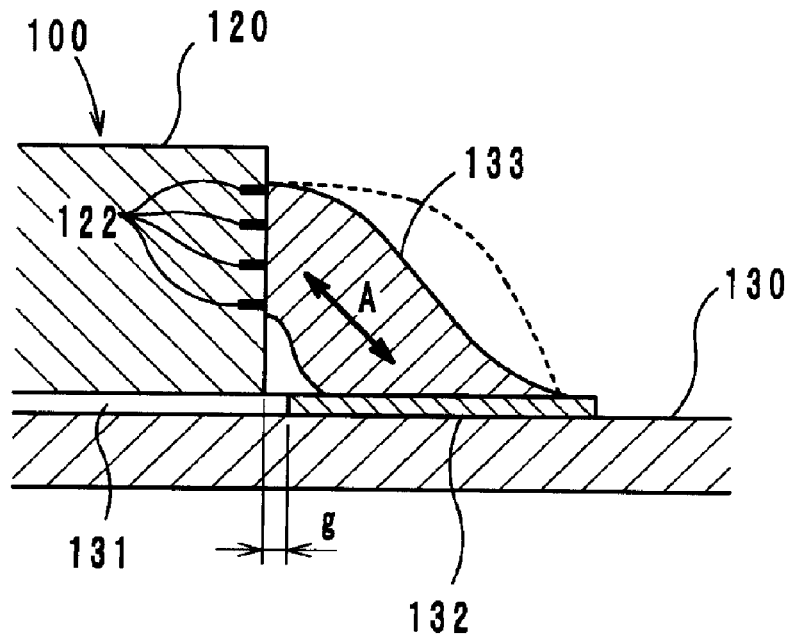
FIG. 41 is a cross-sectional view related to a relevant portion of the wireless IC device according to the thirty-first preferred embodiment of the present invention.

Thirty-First Preferred Embodiment, see FIG. 40 and FIG. 41

As shown in FIG. 40 and FIG. 41, the wireless IC device according to the thirty-first preferred embodiment of the present invention includes the wireless IC chip 5, a feeder circuit substrate 120, and a radiation plate 131. The wireless IC chip 5 processes transmission and reception signals of a predetermined frequency. The wireless IC chip 5 is mounted on the feeder circuit substrate 120 in an electrically connected state. The radiation plate 131 preferably includes an electrode film on the surface of a printed circuit board 130. The integrated wireless IC chip 5 and feeder circuit substrate 120 are referred to as an electromagnetic coupling module 100 below.

The feeder circuit substrate 120 includes a feeder circuit 121 having a resonant circuit/matching circuit that will be described below with reference to FIG. 45 and FIG. 47.

The wireless IC chip 5 preferably includes a clock circuit, a logic circuit, a memory circuit, and the like. The wireless IC chip 5 stores necessary information. As shown in FIG. 19, the pair of input/output terminal electrodes 6 and the pair of mounting terminal electrodes 7 are provided on the back surface of the wireless IC chip 5. In the feeder circuit substrate 120 shown in FIG. 46, the input/output terminal electrodes 6 of the wireless IC chip 5 are electrically connected to feeder terminal electrodes 142a and 142b through metal bumps, or the like, and the mounting terminal electrodes are electrically connected to the mounted electrodes 143a and 143b through metal bump, or the like. In addition, in the feeder circuit substrate 120 shown in FIG. 48, the input/output terminal electrodes 6 are electrically connected to feeder terminal electrodes 222*a* and 222*b* through metal bumps, or the like, and the mounting terminal electrodes 7 are electrically connected to mounted electrodes 223*a* and 223*b* through metal bumps, or the like.

A radiation plate 131 is preferably disposed on the surface of printed circuit board 130 and includes an electrode film made of a nonmagnetic metal material. One end portion 131*a* and the other end portion 131*b* each are arranged to face the lower surface of the feeder circuit substrate 120, and are electromagnetically coupled to the feeder circuit 121. The overall shape of the radiation plate 131 can be varied as desired, and may be, for example, a loop shape or a dipole shape. In addition, the radiation plate 131 may be provided inside the printed circuit board 130. Note that the printed circuit board 130 is incorporated in an article, such as a cellular phone.

Mounting electrodes 122 are preferably provided on two opposite side surfaces of the feeder circuit substrate 120 and are not electrically connected to the feeder circuit 121, which will be described in detail below. As shown in FIG. 41, the mounting electrodes 122 are disposed on the side surfaces of a laminated body (feeder circuit substrate 120) in which an insulating material layer and an electrode layer are laminated so as to expose the electrode layers, and are soldered to mounting lands 132 provided separately from the radiation plate 131 on the printed circuit board 130. The lands 132 are provided separately from the radiation plate 131. Both lands 132 preferably have substantially the same thickness.

In the soldering, first, solder paste 133 is applied to the lands 132 as indicated by the broken line in FIG. 41 (thickness of application is about 100 μm), and the electromagnetic coupling module 100 is placed at a predetermined position on the printed circuit board 130 by a mounter. The radiation plate 131 is provided on the surface of the printed circuit board 130; however, the solder paste 133 is not applied to the radiation plate 131. After that, by passing through a reflow furnace, the mounting electrodes 122 and the lands 132 are soldered to each other.

When the solder paste 133 is in a molten state in the reflow furnace, the solder paste 133 contacts each mounting electrode 122, and the electromagnetic coupling module 100 is adhered onto the printed circuit board 130. After being taken out from the reflow furnace, the solder paste 133 contracts with a decrease in temperature, and hardens in a bridge shape between the lands 132 and the mounting electrodes 122 to generate internal stress in the arrow A direction. By so doing, the feeder circuit substrate 120 is pulled toward the printed circuit board 130, and the lower surface of the feeder circuit substrate 120 closely adheres to the end portions 131*a* and 131*b* of the radiation plate 131.

When considering in detail the above phenomenon at the time of soldering, the above phenomenon is due to a situation that the mounting electrodes 122 are provided on the side surfaces of the feeder circuit substrate 120 away from the lower surface (in other words, the mounting electrodes 122 are disposed only on the side surfaces and not disposed on the lower surface), and a gap g is present between each land 132 and the feeder circuit substrate 120. When the solder paste 133 at the gap g portion contracts at the time of hardening, stress in the arrow A direction occurs.

The feeder circuit substrate 120 directly adheres to the radiation plate 131 because of the stress due to contraction of the solder paste 133. Thus, the feeder circuit substrate 120 and the radiation plate 131 are desirably coupled to each other without variations in gap therebetween, and variations in degree of coupling are substantially eliminated. In addition, because the mounting electrodes 122 are not electrically connected to the feeder circuit 121 and are independent, corrosion of the mounting electrodes 122 due to solder, or the like, does not adversely influence the electrical characteristic and reliability of the electromagnetic coupling module 100.

In addition, the mounting electrodes 122 are disposed on the two opposite side surfaces of the feeder circuit substrate 120, so it is possible to mount the feeder circuit substrate 120 on the printed circuit board 130 with a further improved accuracy in a well balanced manner. Particularly, in the present preferred embodiment, because the mounting electrodes 122 are provided on the two opposite side surfaces of the feeder circuit substrate 120 at line-symmetrical positions, mounting accuracy and balance are further improved.

Moreover, it is only necessary to use a simple manufacturing process, that is, soldering by a reflow furnace, no expensive mounter is required. In addition, after the soldering, the electromagnetic coupling module 100 preferably is coated with a resin material to further improve the bonding strength of the electromagnetic coupling module 100 to the printed circuit board 130.

Figure 42:
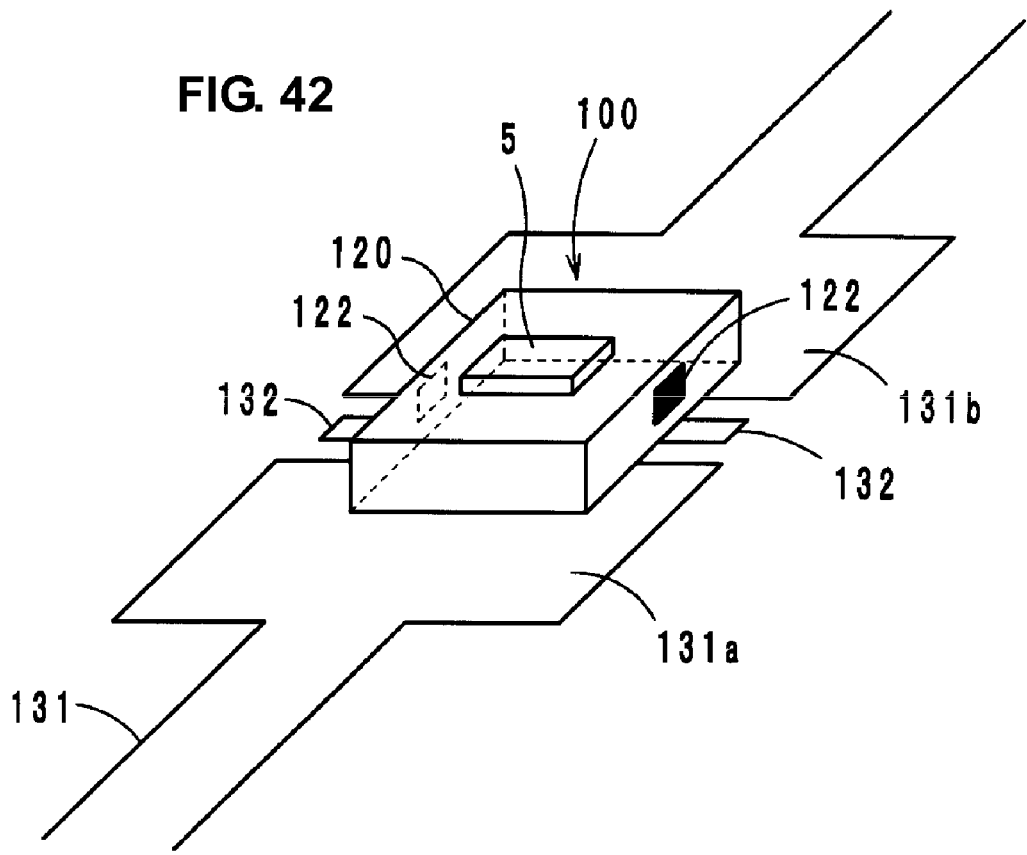
FIG. 42 is a perspective view of a wireless IC device according to a thirty-second preferred embodiment of the present invention.
Figure 43:
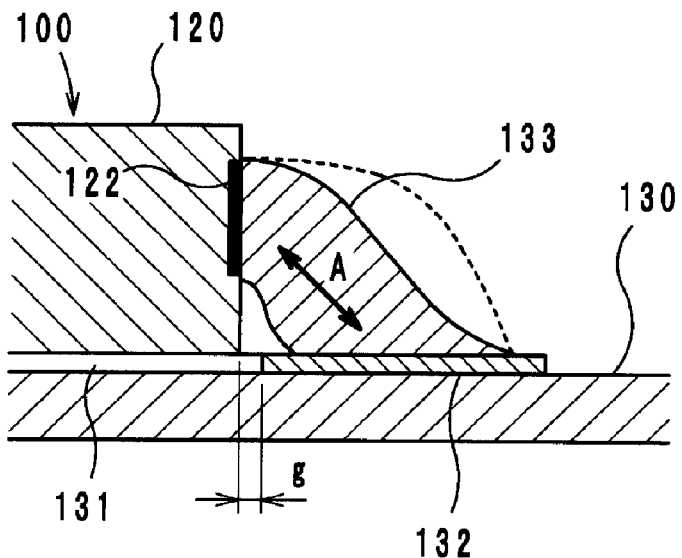
FIG. 43 is a cross-sectional view related to a relevant portion of the wireless IC device according to the thirty-second preferred embodiment of the present invention.

Thirty-Second Preferred Embodiment, see FIG. 42 and FIG. 43

As shown in FIG. 42 and FIG. 43, the wireless IC device according to the thirty-second preferred embodiment basically has a similar configuration to that of the thirty-first preferred embodiment, so like reference numerals denote like components or portions to those of the thirty-first preferred embodiment, and the description thereof is omitted.

The thirty-second preferred embodiment differs from the thirty-first preferred embodiment in that the mounting electrodes 122 are formed of via hole electrodes that are exposed on the side surfaces of the laminated body (feeder circuit substrate 120). In order to expose the via hole electrodes on the side surfaces of the laminated body, it is only necessary that the via hole electrodes are arranged along a cut line of a mother substrate when the feeder circuit substrate 120 is manufactured. A method of forming the above via hole electrodes (conductors) is described in Japanese Unexamined Patent Application Publication No. 2002-26513 in detail.

In the thirty-second preferred embodiment, bonding the mounting electrodes 122 and the lands 132 on the printed circuit board 130 by the solder paste 133 is similar to that of the thirty-first preferred embodiment, and the operations and advantages thereof are also similar.

Figure 44:
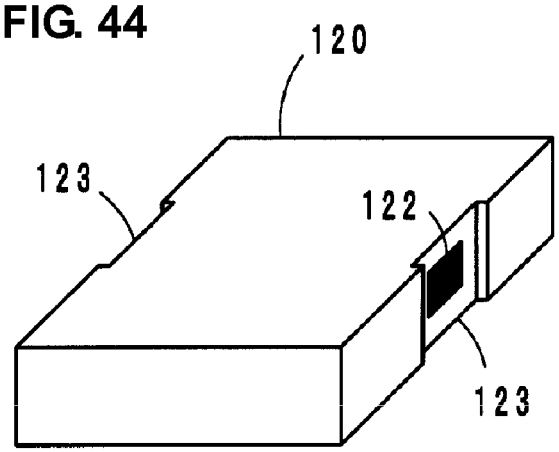
FIG. 44 is a perspective view of an alternative example of a feeder circuit substrate.

Alternative Preferred Embodiment, see FIG. 44

FIG. 44 shows the feeder circuit substrate 120 according to an alternative preferred embodiment to the thirty-second preferred embodiment. The feeder circuit substrate 120 is constructed so that recesses 123 are formed on the side surfaces and the mounting electrodes 122 are arranged in the recesses 123. By arranging the solder paste 133 in the recesses 123, it is possible to prevent spreading of a solder fillet.

Figure 45:
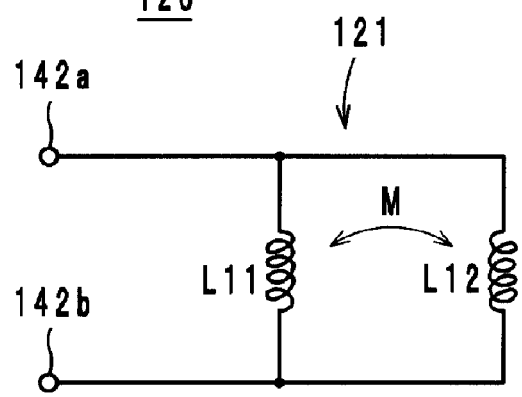
FIG. 45 is an equivalent circuit diagram of a feeder circuit that constitutes a first example of the feeder circuit substrate.
Figure 46:
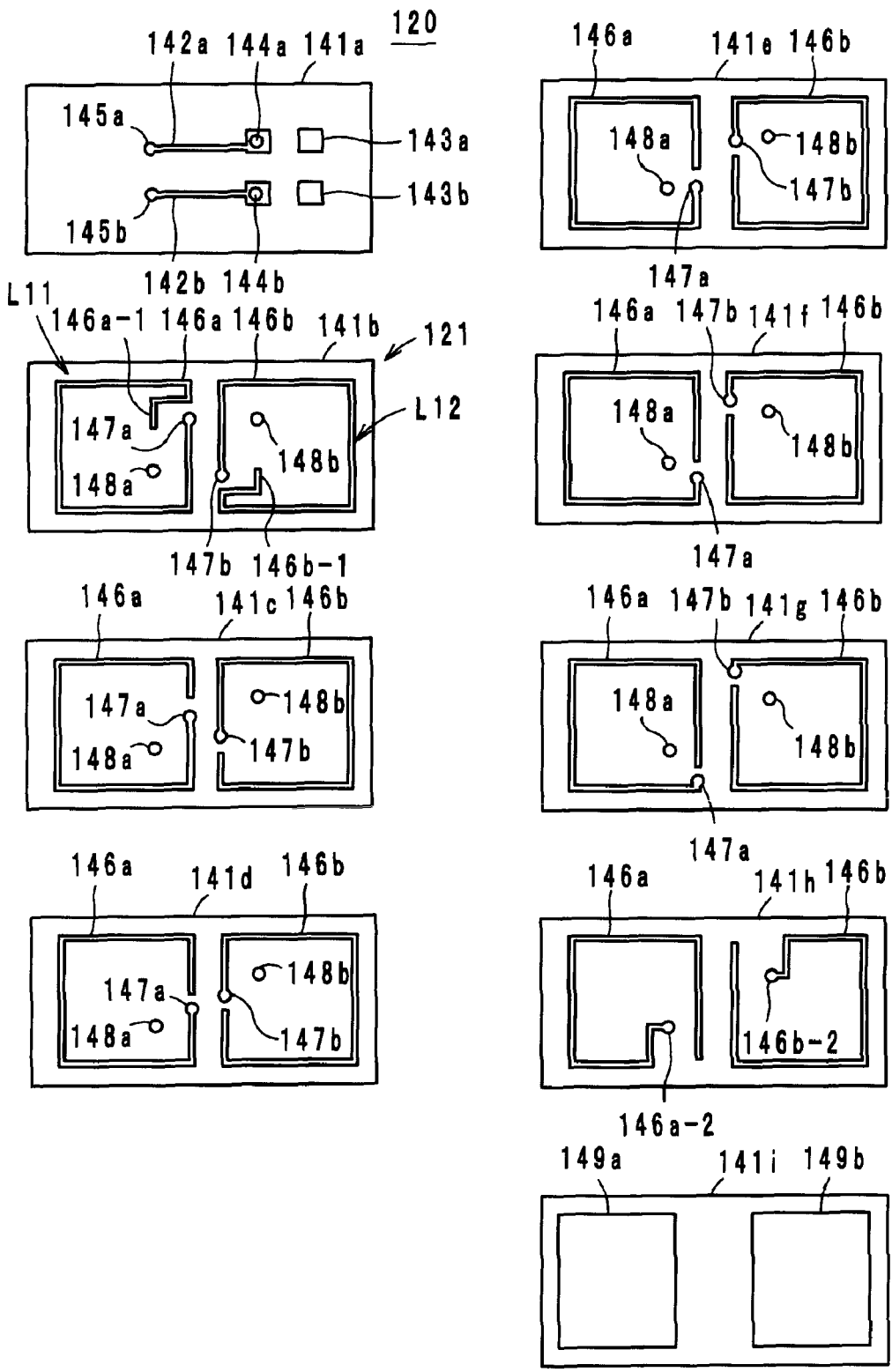
FIG. 46 is a plan view that shows the laminated structure of the first example of the feeder circuit substrate.

First Example of Feeder Circuit Substrate, see FIG. 45 and FIG. 46

Here, the first example of the feeder circuit substrate 120 will be described. As shown in an equivalent circuit in FIG. 45, the feeder circuit substrate 120 includes the feeder circuit 121 that includes a resonant circuit/matching circuit having inductance elements L11 and L12 that have different inductances and that are magnetically coupled (indicated by mutual inductance M) in opposite phases.

The inductance elements L11 and L12 included in the feeder circuit 121 are magnetically coupled in opposite phases and resonate at a frequency processed by the wireless IC chip 5, and are electromagnetically coupled to the end portions 131*a* and 131*b* of the radiation plate 131. In addition, the feeder circuit 121 is electrically connected to the input/output terminal electrode 6 of the wireless IC chip 5 to match the impedance (for example, about 50Ω) of the wireless IC chip 5 with the impedance (spatial impedance of 377 Q, for example) of the radiation plate 131.

Thus, the feeder circuit 121 transmits a transmission signal having a predetermined frequency and output from the wireless IC chip 5 to the radiation plate 131, and selects a reception signal having a predetermined frequency from among signals received by the radiation plate 131 and then supplies the selected reception signal to the wireless IC chip 5. Thus, in the wireless IC device 1, the wireless IC chip 5 is activated by a signal received by the radiation plate 131, and a response signal from the wireless IC chip 5 is radiated outward from the radiation plate 131.

As described above, in the wireless IC device, the feeder circuit 121 provided for the feeder circuit substrate 120 sets a resonant frequency of a signal. Thus, even when the wireless IC device is attached to various types of articles, the wireless IC device operates without any change. Hence, variations in radiation characteristic are prevented, and it is not necessary to change the design of the radiation plate 131, or the like, for each individual article. Then, the frequency of the transmission signal radiated from the radiation plate 131 and the frequency of the reception signal supplied to the wireless IC chip 5 substantially equal to the resonant frequency of the feeder circuit 121 in the feeder circuit substrate 120. A maximum gain of a signal is substantially determined by at least any one of the size or shape of the feeder circuit 121, a distance or a medium between the feeder circuit 121 and the radiation plate 131. The frequencies of the transmission and reception signals are determined on the feeder circuit substrate 120. Thus, irrespective of the shape, size, arrangement, or the like, of the radiation plate 131, for example, even when the wireless IC device is rolled or held between dielectric materials, the frequency characteristic remains unchanged, and the stable frequency characteristic may be obtained.

Next, the configuration of the feeder circuit substrate 120 will be described with reference to FIG. 46. The feeder circuit substrate 120 is constructed so that laminated ceramic sheets 141*a* to 141*i* made of a dielectric material (dielectric material or magnetic material) are pressure-bonded and fired. Feeder terminal electrodes 142*a* and 142*b*, mounted electrodes 143*a* and 143*b* and via hole conductors 144*a*, 144*b*, 145*a* and 145*b* are provided on the uppermost layer sheet 141*a*. On each of the second to eighth layer sheets 141*b* to 141*h*, wiring electrodes 146*a* and 146*b* that constitute the inductance elements L11 and L12 are provided, and via hole conductors 147*a*, 147*b*, 148*a* and 148*b*, or the like, are formed where necessary. Planar electrodes 149*a* and 149*b* are provided on the lowermost layer sheet 141*i*. The planar electrodes 149*a* and 149*b* have an outer shape equal to or smaller than those of the inductance elements L11 and L12 when the feeder circuit substrate 120 is viewed in plan.

By laminating the above sheets 141*a* to 141*i*, the inductance element L11 in which the wiring electrodes 146*a* are spirally connected through the via hole conductors 147*a*, and the inductance element L12 in which the wiring electrodes 146*b* are spirally connected through the via hole conductors 147*b*, are formed. In addition, capacitances are formed between the lines of each of the wiring electrodes 146*a* and 146*b*.

An end portion 146*a*-1 of the wiring electrode 146*a* on the sheet 141*b* is connected to the feeder terminal electrode 142*a* through a via hole conductor 145*a*. An end portion 146*a*-2 of the wiring electrode 146*a* on the sheet 141*h* is connected to the feeder terminal electrode 142*b* through via hole conductors 148*a* and 145*b*. An end portion 146*b*-1 of the wiring electrode 146*b* on the sheet 141*b* is connected to the feeder terminal electrode 142*b* through a via hole conductor 144*b*. An end portion 146*b*-2 of the wiring electrode 146*b* on the sheet 141*h* is connected to the feeder terminal electrode 142*a* through via hole conductors 148*b* and 144*a*. Furthermore, end portions 146*a*-2 and 146*b*-2 of the wiring electrodes 146*a* and 146*b* are connected to the planar electrodes 149*a* and 149*b* through via hole conductors.

In the above described feeder circuit 121, the inductance elements L11 and L12 are respectively wound in opposite directions, so magnetic fields generated in the inductance elements L11 and L12 are cancelled. Because the magnetic fields are cancelled, it is necessary to extend the wiring electrodes 146*a* and 146*b* in order to obtain desired inductances. By so doing, because the Q value decreases, the steep resonant characteristic disappears, and a wide band is obtained around the resonant frequency.

The inductance elements L11 and L12 are located at left and right different positions when the feeder circuit substrate 120 is viewed in plan. In addition, magnetic fields generated in the inductance elements L11 and L12 are opposite in directions. By so doing, when the feeder circuit 121 is coupled to the end portions 131*a* and 131*b* of the loop radiation plate 131, electric currents in opposite directions are excited in the end portions 131*a* and 131*b*. Thus, it is possible to transmit and receive signals by the loop radiation plate 131. Note that the inductance elements L11 and L12 may be respectively coupled to two different radiation plates.

When the feeder circuit substrate 120 is made of a magnetic material, and the inductance elements L11 and L12 are provided in the magnetic material, it is possible to obtain large inductances, and it is possible to handle a frequency of approximately 13.56 MHz band, for example. In addition, even when variations in machining of the magnetic sheets or variations in permeability occur, it is possible to absorb variations in impedance with the wireless IC chip 5. The permeability $\mu$ of the magnetic material is desirably about 70.

In addition, because the two inductance elements L11 and L12 have different inductances, the feeder circuit 121 has a plurality of resonant frequencies to make it possible to widen the band of the wireless IC device. However, the inductances of the inductance elements L11 and L12 may be set at substantially the same value. In this case, it is possible to equalize the magnitudes of the magnetic fields generated in the inductance elements L11 and L12. By so doing, it is possible to equalize the amount by which the magnetic fields are cancelled in the two inductance elements L11 and L12, and a wide band is obtained around the resonant frequency.

Note that the feeder circuit substrate 120 include a multilayer substrate made of ceramics or resin or may be a substrate including laminated flexible sheets made of a dielectric material, such as polyimide and liquid crystal polymer. Particularly, the inductance elements L11 and L12 are incorporated in the feeder circuit substrate 120. Thus, the feeder circuit 121 is less likely to experience interference or influence from outside the substrate, and it is possible to prevent variations in radiation characteristic.

In addition, by providing the planar electrodes 149*a* and 149*b* between the inductance elements L11 and L12 and the radiation plate 131, it is possible to prevent variations in coupling between the feeder circuit 121 and the radiation plate 131. Note that the planar electrodes 149*a* and 149*b* need not be electrically connected to the wiring electrodes 146*a* and 146*b*, and the planar electrodes 149*a* and 149*b* are not necessary.

Figure 47:
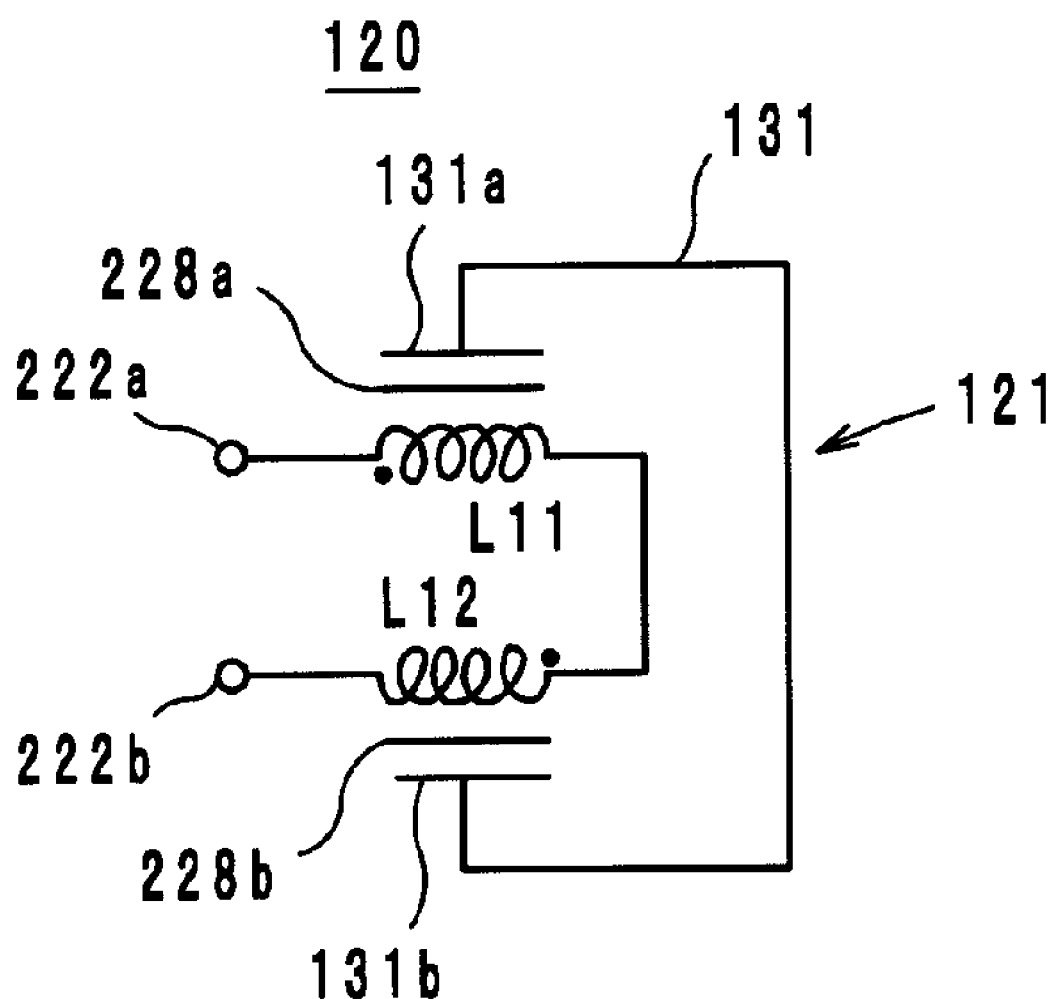
FIG. 47 is an equivalent circuit diagram of a feeder circuit that constitutes a second example of the feeder circuit substrate.
Figure 48:
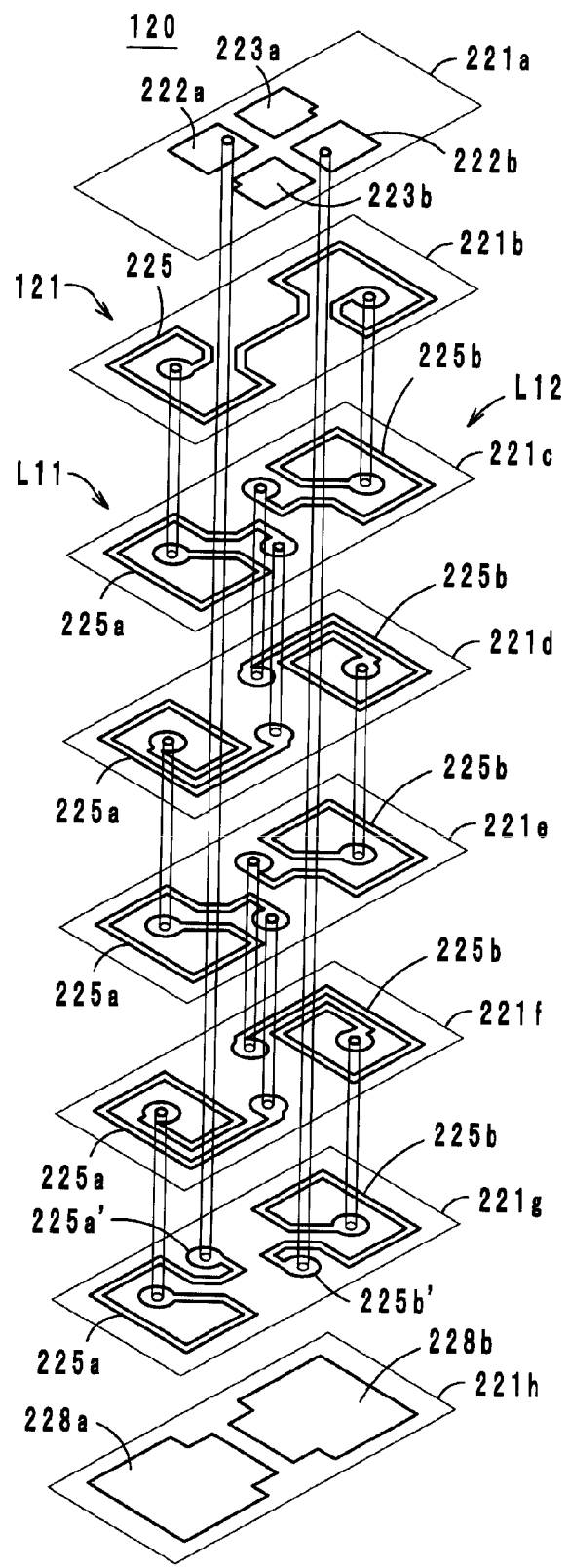
FIG. 48 is a perspective view that shows the laminated structure of the second example of the feeder circuit substrate.

Second Example of Feeder Circuit Substrate, see FIG. 47 and FIG. 48

The second example of the feeder circuit substrate 120 includes an equivalent circuit shown in FIG. 47 and a laminated structure shown in FIG. 48. The feeder circuit substrate 120 is constructed so that laminated ceramic sheets 221a to 221h made of a dielectric material (dielectric material or magnetic material) are pressure-bonded and fired. Feeder terminal electrodes 222a and 222b and mounted electrodes 223a and 223b are provided on the uppermost layer sheet 221a. A wiring electrode 225 is provided on the second layer sheet 221b. Wiring electrodes 225a and 225b that constitute the inductance elements L11 and L12 are provided on the third to seventh layer sheets 221c to 221g. Planar electrodes 228a and 228b are provided on the lowermost layer sheet 221h. Note that description of via hole conductors formed in the sheets 221a to 221f is omitted for the sake of simplification.

By laminating the sheets 221a to 221h, the inductance element L11 in which the wiring electrodes 225a are spirally connected through the via hole conductors, and the inductance element L12 in which the wiring electrodes 225b are spirally connected through the via hole conductors, are formed. In addition, capacitances are formed between the lines of each of the wiring electrodes 225a and 225b.

The wiring electrodes 225a and 225b are integrated in a wiring electrode 225 on the sheet 221b. An end portion 225a' of the wiring electrode 225a on the sheet 221g is connected to a feeder terminal electrode 222a through a via hole conductor. An end portion 225b' of the wiring electrode 225b is connected to a feeder terminal electrode 222b through a via hole conductor.

The feeder circuit 121 that includes the thus configured inductance elements L11 and L12 is the equivalent circuit shown in FIG. 47. The inductance elements L11 and L12 connected in series with the wireless IC chip 5 are magnetically coupled to each other in opposite phases and resonate at a frequency processed by the wireless IC chip 5, and are electromagnetically coupled to the radiation plate 131. In addition, the feeder circuit 121 matches the impedance (for example, about 50Ω) of the wireless IC chip 5 with the impedance (spatial impedance of about 377 Q, for example) of the radiation plate 131.

Thus, the operations and advantages of the second example are similar to those of the above first example. Particularly, by providing the planar electrodes 228a and 228b on the back surface of the feeder circuit substrate 120, it is possible to prevent variations in coupling between the feeder circuit 121 and the radiation plate 131. Note that the planar electrodes 228a and 228b are not necessary.

SUMMARY OF PREFERRED EMBODIMENTS

In a wireless IC device, it is desirable to provide a mounting electrode on a surface of a feeder circuit substrate. When the mounting electrode is provided separately from a feeder electrode and bonded onto a substrate of a radiation plate (for example, electrical connection by a conductive material, such as solder, or connection by an insulating material), the bonding strength improves. Thus, even when the wireless IC device receives an impact due to a drop, or the like, or when thermal stress is applied to the radiation substrate or the feeder circuit substrate, it does not adversely influence electromagnetic coupling between the feeder electrode and the radiation plate. Particularly, it is desirable to form the mounting electrode at an outer edge portion of the feeder circuit substrate. This makes it possible to improve the accuracy of a position at which the feeder circuit substrate is mounted. In addition, the mounting electrode may be disposed on a side surface of the feeder circuit substrate. When the mounting electrode is disposed on the side surface, there will be a spatial room on the back surface of the feeder circuit substrate. Thus, it is possible to utilize almost all the back surface for coupling with the radiation plate. This increases a degree of coupling between the feeder electrode and the radiation plate.

Particularly, by soldering the mounting electrode, which is provided on the side surface of the feeder circuit substrate, onto a mounting land on the substrate on which the radiation plate is provided, a lower surface of the feeder circuit substrate closely adheres to the radiation plate because of hardening contraction of solder. Thus, the feeder circuit substrate and the radiation plate are desirably coupled to each other without variations in gap therebetween, and variations in degree of coupling are substantially eliminated.

The mounting electrode is preferably disposed on each of two opposite side surfaces of the feeder circuit substrate. It is possible to mount the feeder circuit substrate on the substrate with a further improved accuracy in a well balanced manner. Because the mounting electrode is provided on each of the two opposite side surfaces of the feeder circuit substrate at a line-symmetrical position, mounting accuracy and balance are further greatly improved.

The mounting electrode may be located at a distance spaced away from the lower surface of the feeder circuit substrate. This prevents solder from spreading to the lower surface of the feeder circuit substrate. Thus, it is possible to ensure close contact between the feeder circuit substrate and the radiation plate.

The feeder circuit substrate preferably includes a laminated body in which an insulating material layer and an electrode layer are laminated, and the mounting electrode may be arranged so as to expose an electrode layer on at least one of the side surfaces of the laminated body. By forming the mounting electrode using the electrode layer that is partially exposed on the side surface of the laminated body, the mounting strength of the feeder circuit substrate improves.

In addition, the feeder circuit substrate preferably includes a laminated body in which an insulating material layer and an electrode layer are laminated, and the mounting electrode may be arranged in a recess that is formed on at least one of the side surfaces of the laminated body. By arranging solder in the recess, it is possible to prevent spreading of a solder fillet.

In addition, a resonant circuit and/or a matching circuit may be provided in the feeder circuit substrate. In addition, the radiation plate may be disposed on a surface and/or inside of the radiation substrate. In addition, the feeder electrode may be arranged over a range from a surface, facing the radiation plate, of the feeder circuit substrate to at least one of surfaces, not facing the radiation plate, of the feeder circuit substrate. The bonding strength of the feeder electrode improves. A plurality of the feeder electrodes or the mounting electrodes may be provided.

An inductance element and a capacitance element may be respectively provided on the feeder circuit substrate at different positions in plan view and are electromagnetically coupled to different feeder electrodes, and different radiation plates may be respectively coupled to the feeder electrodes. Because capacitive coupling is higher in efficiency of exchanging signal energy than magnetic coupling, it is possible to improve the radiation characteristic. In addition, a coupled state to the feeder electrode may be set separately between the inductance element and the capacitance element, so the degree of freedom for designing the radiation characteristic improves.

In addition, the resonant circuit or the matching circuit may be configured so that the wireless IC is galvanically connected to the feeder electrode. In addition, the resonant circuit or the matching circuit may include an element incorporated in the feeder circuit substrate and an element mounted on the feeder circuit substrate or an element mounted on a substrate on which the radiation plate is provided. When a chip inductor having a large inductance or a chip capacitor having a large capacitance is mounted on the feeder circuit substrate or the radiation substrate, the element incorporated in the feeder circuit substrate may have a small inductance or capacitance. Thus, it is possible to further reduce the size of the feeder circuit substrate.

The feeder circuit desirably includes at least two inductance elements having different inductances. Because of the different inductances, the feeder circuit may have a plurality of resonant frequencies to widen the band of the wireless IC device. Thus, it is possible to use the wireless IC device in all the countries of the world without any change in design.

It is desirable that the feeder circuit is electromagnetically coupled to the radiation plate, and the resonant frequency of a signal radiated from the radiation plate is substantially equal to the self-resonant frequency of the feeder circuit. Because the frequency of a signal is determined by the feeder circuit, so the length or shape of the radiation plate is selectable, and the degree of freedom for designing the radiation plate improves. In addition, irrespective of the shape, size, arrangement, or the like, of the radiation plate, for example, even when the wireless IC device is rolled or held between dielectric materials, the frequency characteristic remains unchanged, and the stable frequency characteristic may be obtained. In addition, even when the wireless IC device is attached to various types of articles, the wireless IC device operates without any change. Hence, variations in radiation characteristic are prevented, and it is not necessary to change the design of the radiation plate, or the like, for each individual article.

It is desirable that no electrode is provided on the lower surface of the feeder circuit substrate. This prevents solder from spreading to the lower surface of the feeder circuit substrate. Thus, it is possible to reliably ensure close contact between the feeder circuit substrate and the radiation plate.

The feeder circuit substrate may include a multilayer substrate made of ceramics or liquid crystal polymer. When the feeder circuit substrate is defined by a multilayer substrate, it is possible to highly accurately incorporate the inductance element or the capacitance element, and a degree of freedom for forming wiring electrodes is greatly improved.

In addition, it is desirable that a sealing resin is provided between the radiation substrate and the feeder circuit substrate or a protection film that covers at least one of the wireless IC chip, the feeder circuit substrate and the radiation plate is provided. The environmental resistance is greatly improved.

In addition, it is desirable that the imaginary portion of an input/output impedance of the wireless IC conjugates with the imaginary portion of an impedance when viewed from a portion of the feeder circuit substrate, connected to the wireless IC, toward the feeder electrode within or near a range of frequency used.

ALTERNATIVE PREFERRED EMBODIMENTS

Note that the wireless IC device and the electronic apparatus according to the present invention are not limited to the above preferred embodiments; they may be modified into various forms within the scope of the present invention.

For example, the resonant circuit may have various configurations, elements and arrangements. In addition, the materials of the various electrodes and feeder circuit substrate described in the preferred embodiments are only illustrative, and a selected material may be used as long as the material has a necessary property. In addition, to mount the wireless IC chip on the feeder circuit substrate, a process other than the metal bump may be used. It is applicable that the wireless IC is not of a chip type but the wireless IC is disposed on the feeder circuit substrate. Furthermore, to fix the mounting electrode of the feeder circuit substrate to the mounting land, adhesive that hardens to contract may be used instead of solder, for example.

In addition, the electronic apparatus equipped with the wireless IC device according to the present invention is not limited to a cellular phone but it may be various wireless communication devices or household electrical appliances, such as a television and a refrigerator.

As described above, the present invention is useful for a wireless IC device and an electronic apparatus, and is particularly advantageous in that it is possible to achieve miniaturization, allows simple and low-cost mounting of a wireless IC, and eliminates the possibility of any damage from occurring to the wireless IC due to static electricity.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A wireless IC device comprising:
a wireless IC arranged to transmit and receive signals;
a feeder circuit substrate including a feeder circuit incorporating an inductance element connected to the wireless IC in a galvanically conductive state and in which a feeder electrode coupled to the inductance element is provided on a surface of the substrate or an inside of the substrate; and
a radiation plate that is electromagnetically coupled to the feeder electrode; wherein an imaginary portion of an input/output impedance of the wireless IC device conjugates with the imaginary portion of an impedance when viewed from a portion of the feeder circuit substrate, connected to the wireless IC, toward the feeder electrode within a range of frequency used.

2. The wireless IC device according to claim 1, further comprising a mounting electrode provided on a surface of the feeder circuit substrate.

3. The wireless IC device according to claim 2, wherein the mounting electrode is not electrically connected to the feeder circuit.

4. The wireless IC device according to claim 2, wherein, between the feeder electrode and the mounting electrode, the mounting electrode is disposed at an outer edge portion of the feeder circuit substrate.

5. The wireless IC device according to claim 2, wherein the mounting electrode is disposed on a side surface of the feeder circuit substrate.

6. The wireless IC device according to claim 5, wherein the mounting electrode is disposed on each of two opposite side surfaces of the feeder circuit substrate.

7. The wireless IC device according to claim 5, wherein the mounting electrode is disposed on each of the two opposite side surfaces of the feeder circuit substrate at line-symmetrical positions.

8. The wireless IC device according to claim 5, wherein the mounting electrode is disposed at a distance spaced away from a lower surface of the feeder circuit substrate.

9. The wireless IC device according to claim 5, wherein the feeder circuit substrate includes a laminated body in which an insulating material layer and an electrode layer are laminated, and the mounting electrode is arranged so as to expose the electrode layer on at least one of surfaces of the laminated body.

10. The wireless IC device according to claim 5, wherein the feeder circuit substrate includes a laminated body in which an insulating material layer and an electrode layer are laminated, and the mounting electrode is arranged in a recess formed on at least one of side surfaces of the laminated body.

11. The wireless IC device according to claim 1, further comprising a resonant circuit that is provided in the feeder circuit substrate.

12. The wireless IC device according to claim 11, wherein the resonant circuit or the matching circuit is arranged so that the wireless IC is galvanically connected to the feeder electrode.

13. The wireless IC device according to claim 11, wherein the resonant circuit or the matching circuit includes an element incorporated in the feeder circuit substrate and an element mounted on the feeder circuit substrate.

14. The wireless IC device according to claim 11, wherein the resonant circuit or the matching circuit includes an element provided for the feeder circuit substrate and an element mounted on a substrate for which the radiation plate is provided.

15. The wireless IC device according to claim 1, further comprising a matching circuit that is provided in the feeder circuit substrate.

16. The wireless IC device according to claim 1, wherein the radiation plate is provided on a surface and/or inside of a radiation substrate.

17. The wireless IC device according to claim 1, further comprising a substrate-side mounted electrode that is provided on a surface of a radiation substrate in which the radiation plate is provided, wherein the substrate-side mounted electrode is electrically connected to the mounting electrode of the feeder circuit substrate.

18. The wireless IC device according to claim 1, wherein the substrate-side mounted electrode is electrically connected to the radiation plate.

19. The wireless IC device according to claim 1, wherein the feeder electrode is arranged over a range from a surface, facing the radiation plate, of the feeder circuit substrate to at least one of surface of the feeder circuit substrate that does not face the radiation plate.

20. The wireless IC device according to claim 1, wherein a plurality of the radiation plates are provided.

21. The wireless IC device according to claim 1, wherein a plurality of the feeder electrodes and/or a plurality of the mounting electrodes are provided on a surface of the feeder circuit substrate.

22. The wireless IC device according to claim 1, further comprising a sealing resin that is provided between a radiation substrate, on which the radiation plate is provided, and the feeder circuit substrate.

23. The wireless IC device according to claim 1, wherein the feeder circuit includes at least two inductance elements having different inductances.

24. The wireless IC device according to claim 1, wherein
the feeder circuit substrate includes the inductance element and a capacitance element at different positions in plan view,
the capacitance element is electromagnetically coupled to a feeder electrode that is different from the feeder electrode to which the inductance element is electromagnetically coupled, and
the different radiation plates are respectively coupled to the feeder electrodes in a galvanically non-conductive state.

25. The wireless IC device according to claim 1, wherein the feeder circuit substrate is defined by a multilayer substrate.

26. The wireless IC device according to claim 1, further comprising a protection film arranged to cover at least one of a wireless IC chip arranged to transmit and receive signals, the feeder circuit substrate and the radiation plate.

27. An electronic apparatus comprising:
a wireless IC device including:
a wireless IC arranged to transmit and receive signals;
a feeder circuit substrate including a feeder circuit incorporating an inductance element connected to the wireless IC in a galvanically conductive state and in which a feeder electrode coupled to the inductance element is provided on a surface of the substrate or an inside of the substrate; and
a radiation plate that is electromagnetically coupled to the feeder electrode; wherein
an imaginary portion of an input/output impedance of the wireless IC device conjugates with the imaginary portion of an impedance when viewed from a portion of the feeder circuit substrate, connected to the wireless IC, toward the feeder electrode within a range of frequency used.

28. An electronic apparatus comprising:
a wireless IC device including: according to claim 1,
a wireless IC arranged to transmit and receive signals;
a feeder circuit substrate including a feeder circuit incorporating an inductance element connected to the wireless IC in a galvanically conductive state and in which a feeder electrode coupled to the inductance element is provided on a surface of the substrate or an inside of the substrate; and
a radiation plate that is electromagnetically coupled to the feeder electrode; wherein
an imaginary portion of an input/output impedance of the wireless IC device conjugates with the imaginary portion of an impedance when viewed from a portion of the feeder circuit substrate, connected to the wireless IC, toward the feeder electrode within a range of frequency used; and
the radiation plate is provided for a printed wiring board incorporated in an apparatus casing, and the feeder electrode provided for the feeder circuit substrate is electromagnetically coupled to the radiation plate.

* * * * *